(12) United States Patent
Yamashita et al.

(10) Patent No.: US 6,928,535 B2
(45) Date of Patent: Aug. 9, 2005

(54) DATA INPUT/OUTPUT CONFIGURATION FOR TRANSFER AMONG PROCESSING ELEMENTS OF DIFFERENT PROCESSORS

(75) Inventors: Hirofumi Yamashita, Yokohama (JP); Charles G. Sodini, Belmont, MA (US)

(73) Assignee: Kabushiki Kaisha Toshiba, Kawasaki (JP)

(*) Notice: Subject to any disclaimer, the term of this patent is extended or adjusted under 35 U.S.C. 154(b) by 399 days.

(21) Appl. No.: 10/195,477

(22) Filed: Jul. 16, 2002

(65) Prior Publication Data

US 2002/0195544 A1 Dec. 26, 2002

Related U.S. Application Data

(62) Division of application No. 09/521,108, filed on Mar. 7, 2000, now Pat. No. 6,452,149.

(51) Int. Cl.[7] ............................................. G06F 15/80
(52) U.S. Cl. ......................... 712/225; 712/11; 712/20; 712/32
(58) Field of Search .............................. 712/11, 20, 32, 712/225

(56) References Cited

U.S. PATENT DOCUMENTS

| | | | |
|---|---|---|---|
| 3,308,436 A | * 3/1967 | Borck, Jr. et al. ............ | 712/10 |
| 3,537,074 A | * 10/1970 | Stokes et al. ................. | 712/14 |
| 4,684,991 A | 8/1987 | Forchheimer et al. ....... | 348/309 |
| 5,253,346 A | * 10/1993 | Okabayashi et al. ........ | 709/218 |
| 5,694,495 A | 12/1997 | Hara et al. ................... | 382/324 |
| 5,949,483 A | 9/1999 | Fossum et al. ............... | 348/303 |
| 6,166,367 A | 12/2000 | Cho .............................. | 250/208.1 |
| 6,303,923 B1 | 10/2001 | Wadsworth et al. ......... | 250/214 LA |
| 2001/0012070 A1 | 8/2001 | Enod et al. ................... | 348/302 |

OTHER PUBLICATIONS

Jeffrey C. Gealow et al., "System Design For Pixel–Parallel Image Processing", IEEE Transactions On Very Large Scale Integration (VLSI) Systems, vol. 4, No. 1, pp. 32–41, Mar. 1996.

Jeffrey C. Gealow et al., "A Pixel–Parallel Image Processor Using Logic Pitch–Matched To Dynamic Memory", IEEE Journal Of Solid–State Circuits, vol. 34, No. 6, pp. 831–839, Jun. 1999.

Jeffrey C. Gealow, "An Integrated Computing Structure For Pixel–Parallel Image Processing", Massachusetts Institute of Technology, pp. 1–129, Jun. 1997.

* cited by examiner

Primary Examiner—Kenneth S Kim
(74) Attorney, Agent, or Firm—Banner & Witcoff, Ltd.

(57) ABSTRACT

An image input section and a signal processing section are provided. The image input section includes an array of pixel in which a plurality of pixels having a CMOS type photoelectric converting element for converting incident light to an electric signal are arranged in a matrix, and a data read-out circuit having the same number of A/D converters as the number of the pixels arranged in one row of the array of pixel and serving to convert the analog signal converted by the pixels into a digital signal and to output the digital signal. The signal processing section includes plurality of processors. Each of the processors includes a plurality of processing elements (PE) provided on the A/D converter provided in the data read-out circuit by one to one. Moreover, a plurality of PEs provided in each of the processors have the same data processing function in the same processor. Furthermore, the PEs in the processor carry out a signal processing in parallel in response to an instruction.

13 Claims, 17 Drawing Sheets

DATA INPUT/OUTPUT CONFIGURATION FOR TRANSFER AMONG PROCESSING ELEMENTS OF DIFFERENT PROCESSORS

This application is a Divisional of U.S. application Ser. No. 09/52 1,108 filed on Mar. 7, 2000.

BACKGROUND OF THE INVENTION

The present invention relates to a signal processing device and an image input device for an image signal formed into one chip which includes a MOS type solid image sensing device.

In recent years, the MOS type solid image sensing device has been used as various image input devices. In particular, an image sensing element of a type referred to as a CMOS type image sensing element which is fabricated by the CMOS manufacturing technique has widely been used. Most of integrated circuit elements other than the image sensing element are also fabricated by the same CMOS manufacturing technique as in the CMOS type image sensing device. In a CMOS type image sensing device chip, therefore, it is possible to integrate, on the same chip, other integrated circuit elements, particularly, a digital signal processing circuit and a memory element as well as the image sensing element. In recent years, an image input device which is small-sized and consumes less power has been required.

FIG. 1 shows an example of a structure of a conventional image input chip fabricated to meet such a demand. An image input chip 10 comprises an image input section 11 and a signal processing section 12.

The image input section 11 includes an array of pixel 14 in which a plurality of pixels 13 having a CMOS type photoelectric converting element for converting incident light into an electric signal (an analog signal), for example, are arranged in a matrix, and a plurality of analog to digital (A/D) converters 15 for converting the analog signal converted by the pixels 13 into a digital signal and outputting the digital signal.

The signal processing section 12 is provided for the A/D converter 15 by one to one, and includes a plurality of processing elements (PE) 16 for carrying out a signal processing by using the digital signals output from the A/D converters 15 and a signal output circuit 17 for outputting the result of the processing performed by the PE 16 to the outside of the chip. Each of the PEs 16 in the signal processing section 12 carries out a signal processing according to an instruction generated by a controller 18.

The analog signal converted by the pixel 13 in the array of pixel 14 is sequentially converted into a digital signal by the A/D converters 15 in a row unit, and is transmitted to the signal processing section 12. In the signal processing section 12, a signal processing is carried out in parallel according to the instruction generated by the controller 18 by means of the PEs 16. The processed signal is output from the signal output circuit 17 to the outside of the chip.

In the image input chip shown in FIG. 1, thus, the image input section and the signal processing section are formed on the same chip. Therefore, as compared with the case in which the signal processing is carried out with a signal processing chip other than the image input chip, the system size can be reduced and an inexpensive image input system can be implemented.

In the image input system in which the image input chip and the signal processing chip are divided, moreover, it is necessary to drive a comparatively great load capacity attached to a wiring when a signal is to be transmitted from the image input chip to the signal processing chip. For this reason, consumed power has been increased. In the chip shown in FIG. 1, however, it is not necessary to consume power for signal transmission between the chips. Consequently, an image input system having low power consumption can be implemented.

However, the conventional example shown in FIG. 1 has the following problems. More specifically, when the PEs 16 are arranged for each column of the array of pixel 14, the width in the column direction of the pixel 13 is small, that is, approximately several μm. Therefore, the circuit scale and the signal processing capability of the PE 16 which can be arranged are limited, resulting in a low signal processing speed. In general, the amount of data to be processed is large in an image processing. Therefore, if the signal processing speed is low, troubles are practically made. Thus, the use of the image input device is restricted.

BRIEF SUMMARY OF THE INVENTION

Accordingly, it is an object of the present invention to provide a processor capable of processing image data at a high speed.

It is another object of the present invention to provide an image input system which can process image data at a high speed and consumes less power.

The present invention provides a processor comprising a plurality of processors, each of the processors including a plurality of processing elements having the same data processing function, each of the processors receiving a control signal, and the plurality of processing elements in the processor carrying out a data processing in parallel in response to the control signal, a controller for giving the control signal to the processors, and a plurality of data transfer lines provided for mutually transferring data between the plurality of processing elements belonging to the processors which are different from each other.

The present invention provides an image input system comprising a solid image sensing section including an array of pixel in which a plurality of pixels are arranged in a matrix and a data read-out circuit for reading a signal from the pixel in the array of pixel and outputting pixel data, a signal processing section including a plurality of processors, the signal processing section being provided adjacently to the solid image sensing section, each of the processors including a plurality of processing elements having the same function, each of the processors receiving the pixel data read from the solid image sensing section and a control signal, the processing elements in each of the processors carrying out a data processing using the pixel data in parallel in response to the control signal, and a plurality of first data transfer lines for mutually transferring data between the plurality of processing elements belonging to the processors which are different from each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
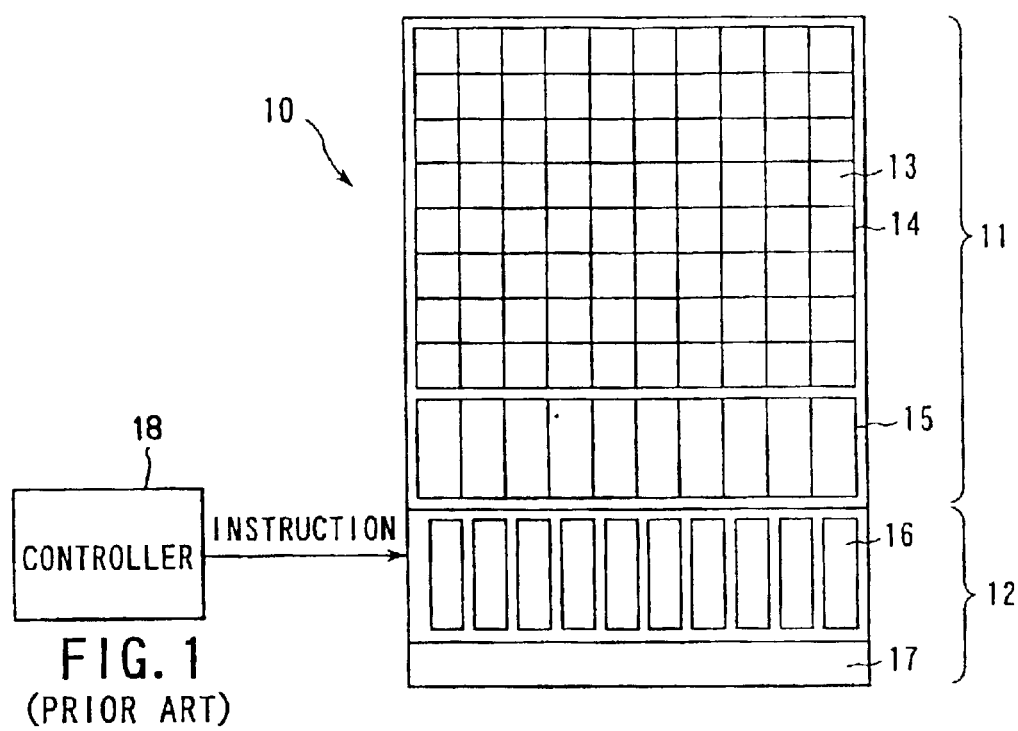
FIG. 1 is a diagram showing an example of the structure of an image input chip according to the prior art.

Preferred embodiments of the present invention will be described below with reference to the drawings. In all the drawings, common portions have common reference numerals and their repetitive description will be omitted.

Figure 2:
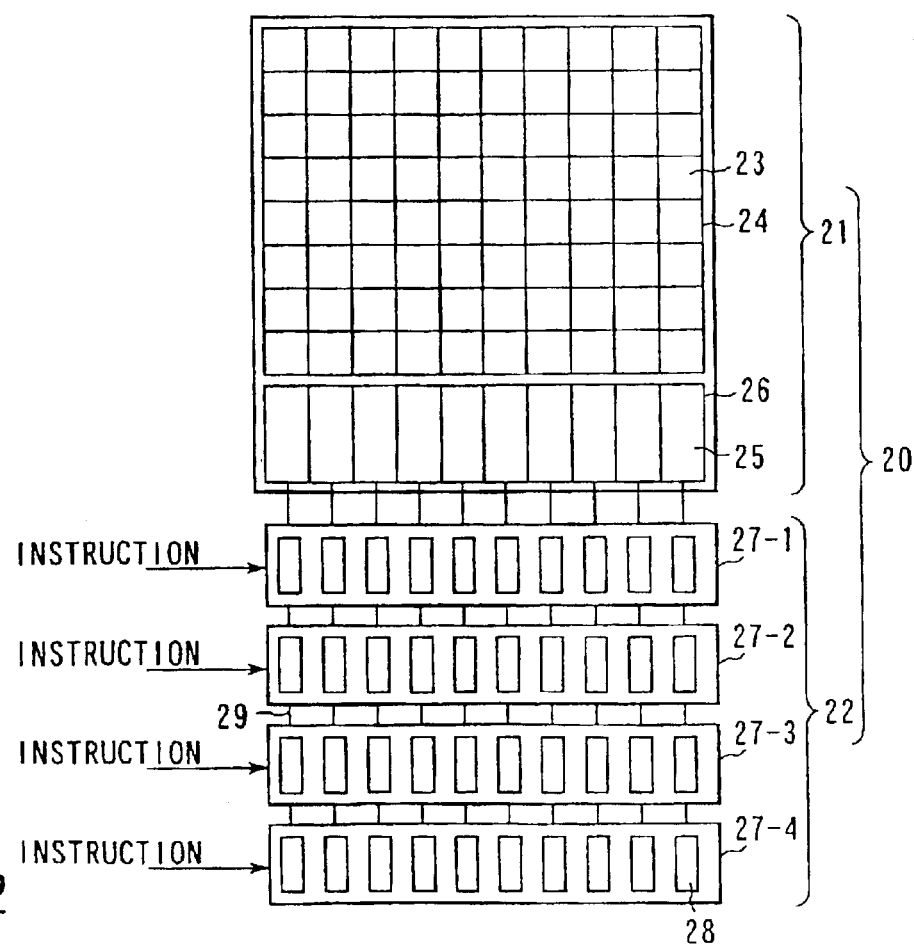
FIG. 2 is a diagram showing the structure of an image input system (an image input chip) formed into one chip according to a first embodiment of the present invention.
Figure 3A:
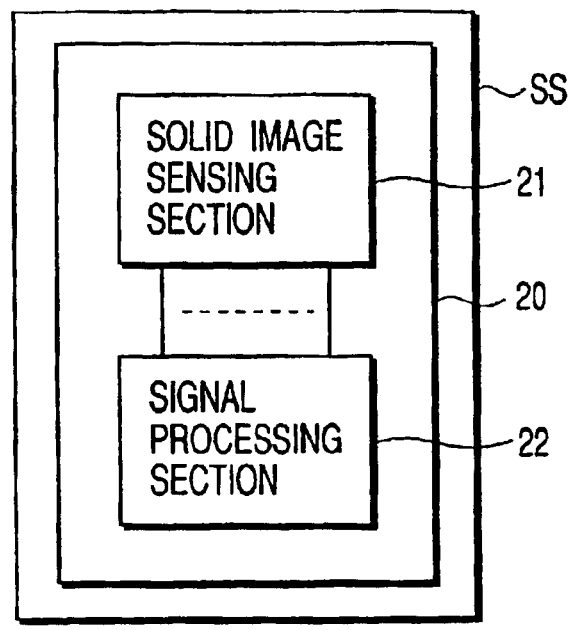
FIGS. 3A and 3B are diagrams each showing a state in which the whole image input system is integrated onto one semiconductor substrate according to the first embodiment and an image input chip illustrate in FIG. 20.

FIG. 2 shows the structure of an image input system (an image input chip) formed into one chip according to a first embodiment of the present invention. An image input chip 20 is wholly integrated on a semiconductor substrate SS as shown in FIG. 3A, and includes an image input section 21 and a signal processing section 22 provided adjacently thereto.

The image input section 21 includes an array of pixel 24 in which a plurality of pixels 23 having a CMOS type photoelectric converting element for converting incident light into an electric signal (an analog signal), for example, are arranged in a matrix (having 8 rows and 10 columns in the present embodiment), and a data read-out circuit 26 having the same number (ten in the present embodiment) of A/D converters 25 as the number of the pixels 23 arranged on one column of the array of pixel 24 (the number of columns), and serving to convert the analog signal converted by the pixels 23 into a digital signal (pixel data) and to output the digital signal.

The signal processing section 22 includes a plurality of signal processing devices (processors), that is, four processors 27-1 to 27-4 in the present embodiment. These four processors 27-1 to 27-4 include a plurality of (ten in the present embodiment) processing elements (PE) 28 which are provided on the A/D converters 25 by one to one in the data read-out circuit 26, respectively. A plurality of PEs 28 provided in the processors 27-1 to 27-4 have the same data processing function in the same processor, and furthermore, the PEs 28 in each processor carry out a signal processing in parallel in response to an instruction.

Moreover, the four processors 27-1 to 27-4 are mutually connected through a plurality of wirings 29. The wirings 29 are also connected to the data read-out circuit 26.

With such a structure, incident light is converted into an electric signal (an analog signal) by each of the pixels 23 in the image input section 21. The analog signal thus obtained by the conversion is sequentially A/D-converted in a row unit in order of a first row, a second row, a third row, . . . , of the array of pixel 24 in the data read-out circuit 26. The digital signal obtained by the conversion in the data read-out circuit 26 is sequentially input to the signal processing section 22 through each of the wirings 29. In the signal processing section 22, the four processors 27-1 to 27-4 share the signal processing. In that case, mutual data transfer between the processors 27-1 to 27-4 is carried out through the wirings 29.

According to the above-mentioned embodiment, thus, a plurality of (four in the present embodiment) processors 27-1 to 27-4 are provided in the signal processing section 22. These processors 27-1 to 27-4 share the image data processing. Therefore, a data processing speed can be increased.

In addition, the image input section 21 and the signal processing section 22 are formed in the same image input chip 20, and the wirings 29 connecting both of them are also provided in the same chip. For this reason, a load capacity in each of the wirings 29 is reduced and loss power is required for driving the wirings 29. Consequently, consumed power can also be reduced.

Figure 4:
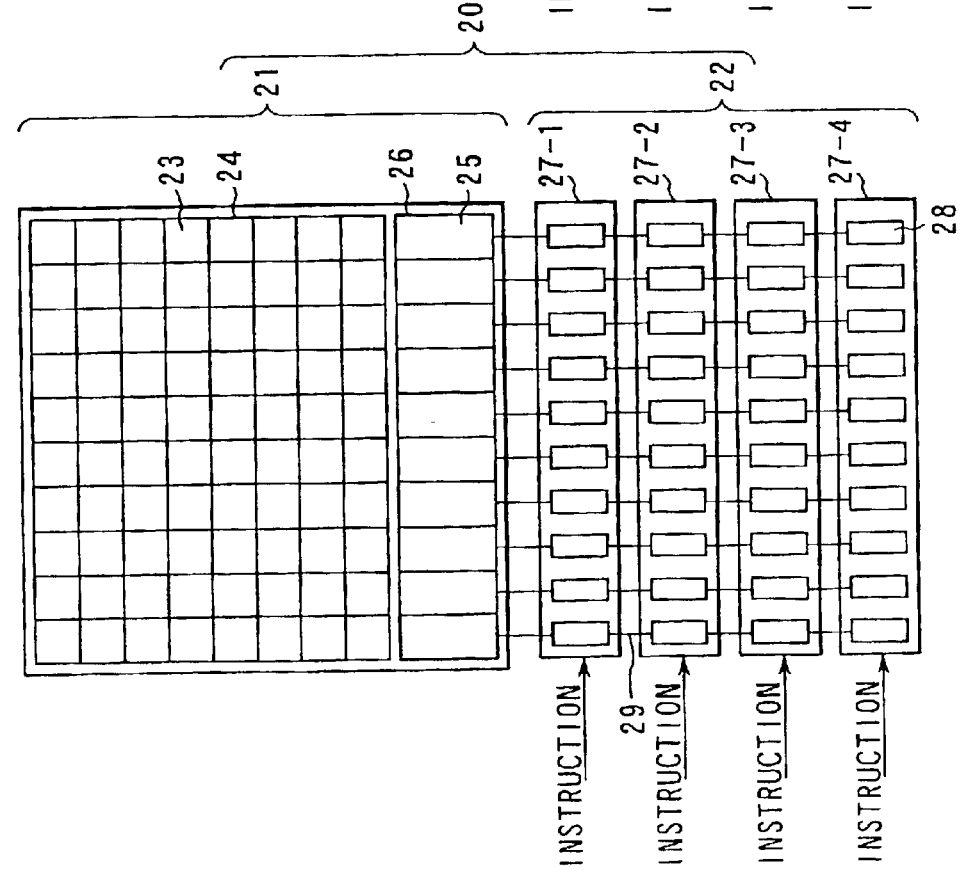
FIG. 4 is a diagram specifically showing a plurality of wirings according to the first embodiment.

FIG. 4 is a diagram specifically showing the wirings 29 in the first embodiment. In the present embodiment, the wirings 29 are provided to connect respective four PEs 28 belonging to the four processors 27-1 to 27-4 which are different from each other and a corresponding one of the A/D converters 25 in the data read-out circuit 26, respectively.

Figure 5:
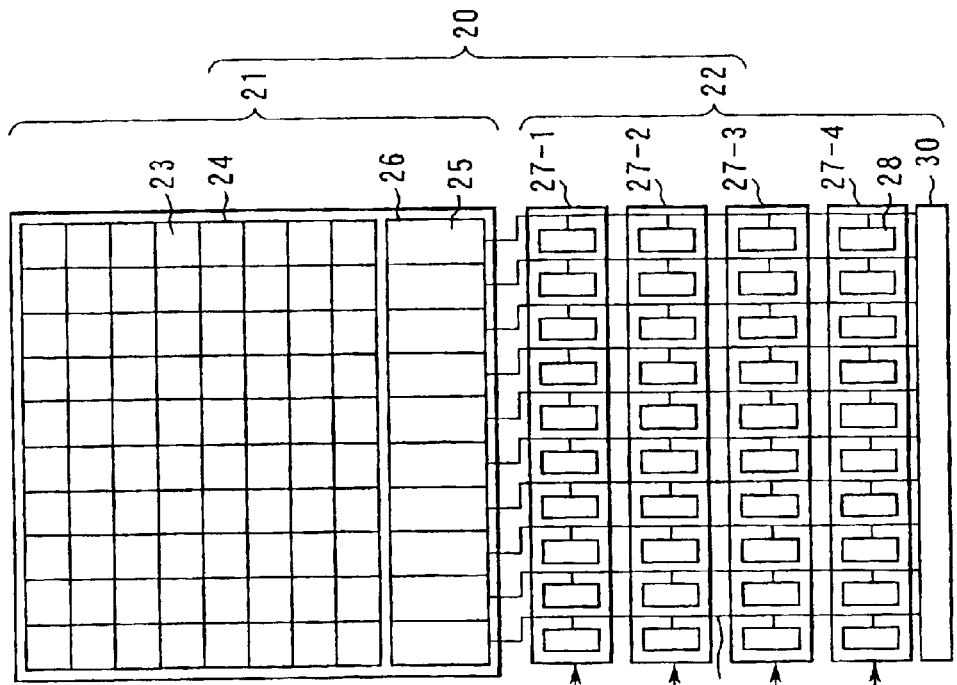
FIG. 5 is a diagram showing another specific example of the wirings according to the first embodiment.

FIG. 5 is a diagram showing another specific example of the wirings 29 according to the first embodiment. In the present embodiment, each of the wirings 29 is provided to be extended in the column direction in the signal processing section 22, and each of the PEs 28 of the four processors 27-1 to 27-4 is connected to a corresponding one of the wirings 29 in the vicinity thereof.

In FIG. 5, a signal output circuit 30 is connected to the wirings 29. The signal output circuit 30 serves to output a signal processed by the signal processing section 22 to the outside of the chip. The signal output circuit 30 may be provided in FIGS. 2 and 4. The signal output circuit 30 can be constituted by a multiplexer and a shift register, for example.

Figure 6:
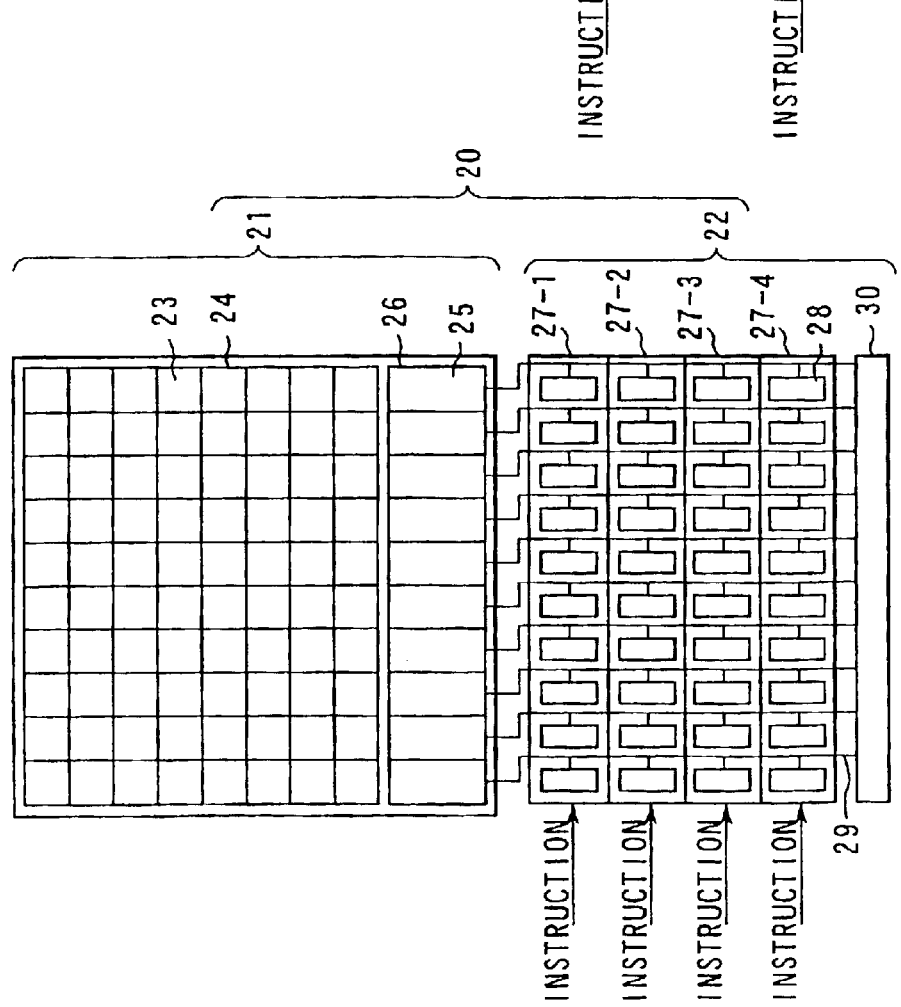
FIG. 6 is a diagram showing the structure of an image input system (an image input chip) formed into one chip according to a second embodiment of the present invention.

FIG. 6 shows the structure of an image input system (an image input chip formed into one chip according to a second embodiment of the present invention.

In the present embodiment, a plurality of PEs 28 are arranged one-dimensionally in the row direction in four processors 27-1 to 27-4 in a signal processing section 22 respectively, and the array width in the column direction of each of the PEs 28 is substantially equal to that in the column direction of a pixel 23 of an array of pixel 24, and the array width of the PE 28 in each of the processors 27-1 to 27-4 is set substantially equal to each other.

Thus, the PE28 can be provided with a high density in the signal processing section 22.

Figure 7:
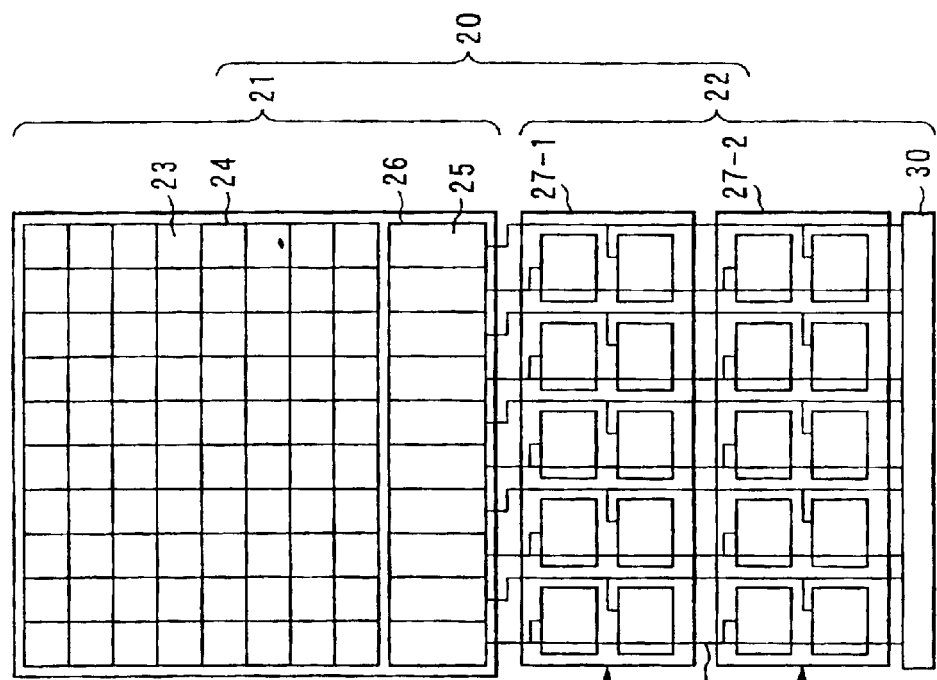
FIG. 7 is a diagram showing the structure of an image input system (an image input chip) formed into one chip according to a third embodiment of the present invention.

FIG. 7 shows the structure of an image input system (an image input chip) formed into one chip according to a third embodiment of the present invention.

In the present embodiment, two processors 27-1 and 27-2 are provided in a signal processing section 22. In each of the processors 27-1 and 27-2, a plurality of (eight in the present embodiment) PEs 28A are arranged two-dimensionally in two rows and a plurality of columns. Accordingly, the number of the columns of the PEs 28A in each of the processors 27-1 and 27-2 is a half of the number of the columns of pixels 23 of an array of pixel 24. The array width in the column direction of each of the PEs 28A is twice as great as that in the column direction of the pixel 23 of the array of pixel 24.

Moreover, each PE 28 is connected to any of a plurality of wirings 29 which corresponds to the column of the array of pixel 24. The wirings 29 are provided to be extended in the column direction in the signal processing section 22 in the same manner as in FIG. 6.

By thus providing the PEs 28A, the circuit in each PE 28 can be formed in a greater pitch than the array width pitch in the column direction of the pixel 23 of the array of pixel 24. Thus, the limitations on a circuit layout can be reduced.

Figure 8:
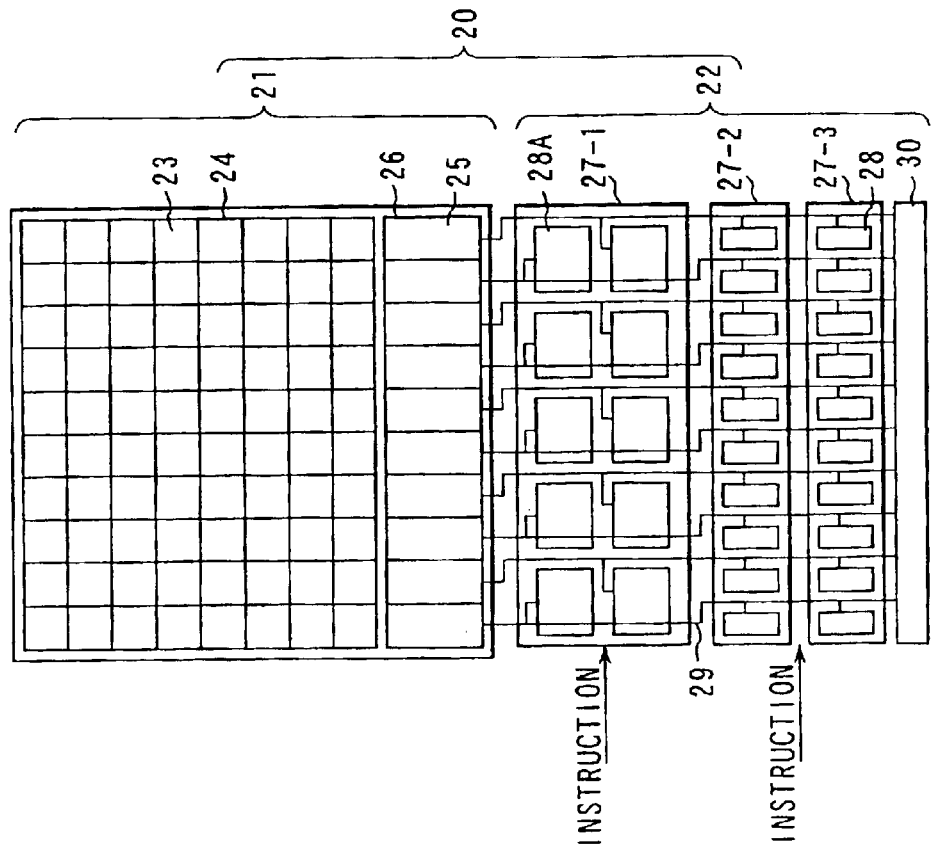
FIG. 8 is a diagram showing the structure of an image input system (an image input chip) formed into one chip according to a fourth embodiment of the present invention.

FIG. 8 shows the structure of an image input system (an image input chip) formed into one chip according to a fourth embodiment of the present invention.

In the present embodiment, a plurality of (three in the present embodiment) processors 27-1 to 27-3 are provided in a signal processing section 22. In the processor 27-1, a plurality of (eight in the present embodiment) PEs 28A are arranged two-dimensionally in two rows and a plurality of columns in the same manner as in FIG. 7, and the number of the columns of the PEs 28A is half of the number of columns of a pixel 23 of an array of pixel 24. Accordingly, the array width in the column direction of each of the PEs 28 in the processor 27-1 is substantially twice as great as the array width in the column direction of the pixel 23 of the array of pixel 24. On the other hand, in each of the residual two processors 27-2 and 27-3, a plurality of (eight in the present embodiment) PEs 28 are arranged one-dimensionally in the row direction in the same manner as in FIGS. 5 and 6, and the array width in the column direction of each PE 28 is made substantially equal to the array width in the column direction of the pixel 23 of the array of pixel 24 and the array widths in the column direction of all the PEs 28 in both processors 27-2 and 27-3 are made substantially equal to each other.

By changing the array width in the column direction of the PE in each of the processors, thus, the degree of freedom of the circuit in the signal processing section 22 is increased.

Figure 9:
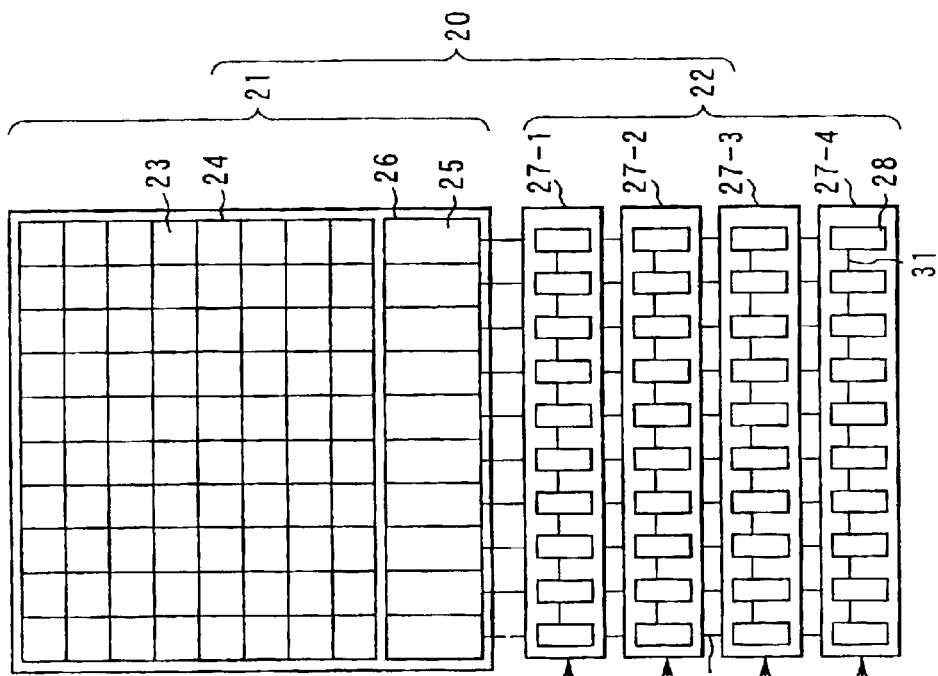
FIG. 9 is a diagram showing the structure of an image input system (an image input chip) formed into one chip according to a fifth embodiment of the present invention.

FIG. 9 shows the structure of an image input system (an image input chip) formed into one chip according to a fifth embodiment of the present invention.

In the present embodiment, a plurality of (four in the present embodiment) processors 27-1 to 27-4 are provided in a signal processing section 22. The four processors 27-1 to 27-4 are mutually connected through a plurality of wirings 29, and furthermore, a wiring 31 extended in the row direction to mutually connect a plurality of PEs 28 is provided in each of the processors 27-1 to 27-4.

In the same processor, consequently, the PEs 28 can transfer a signal through the wiring 31, and a signal processing can be carried out by using pixel data corresponding to the pixels 23 belonging to the different columns in the array of pixel 24.

Figure 10:
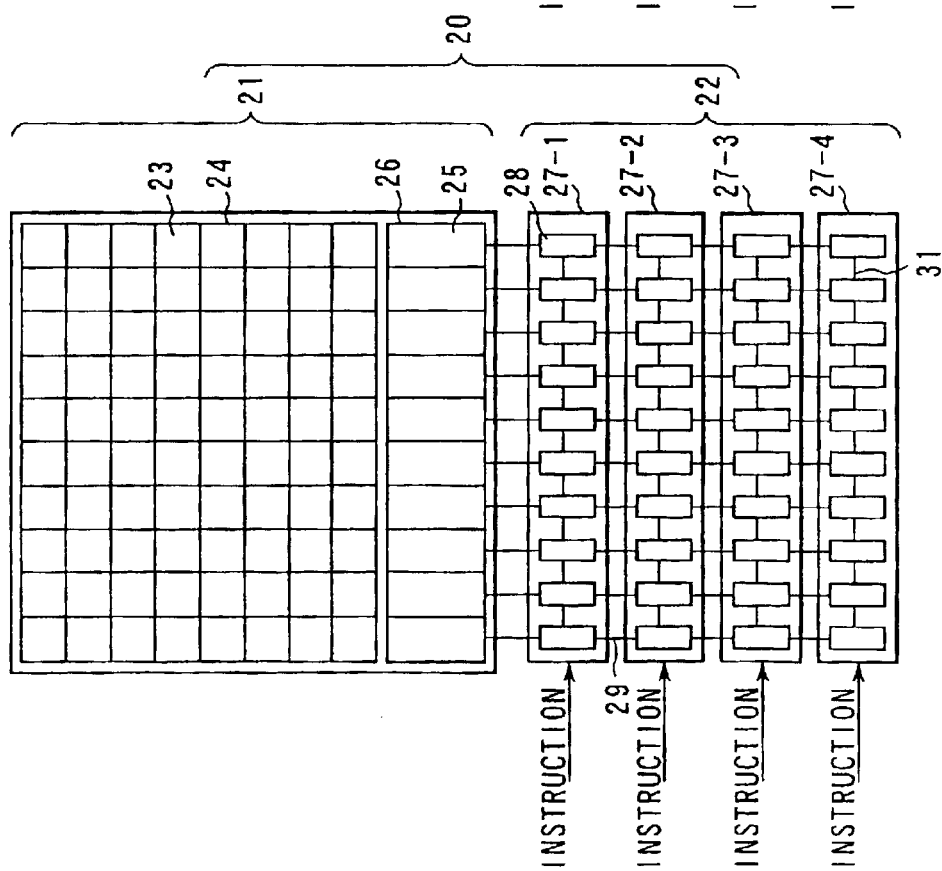
FIG. 10 is a diagram specifically showing a plurality of wirings according to the fifth embodiment.

FIG. 10 is a diagram specifically showing the wirings 29 according to the fifth embodiment. In this example, in the same manner as in FIG. 4, each of the wirings 29 is provided to connect four PEs 28 belonging to each of the four processors 27-1 to 27-4 which are different from one another to a corresponding one of A/D converters 25 in a data read-out circuit 26.

Figure 11:
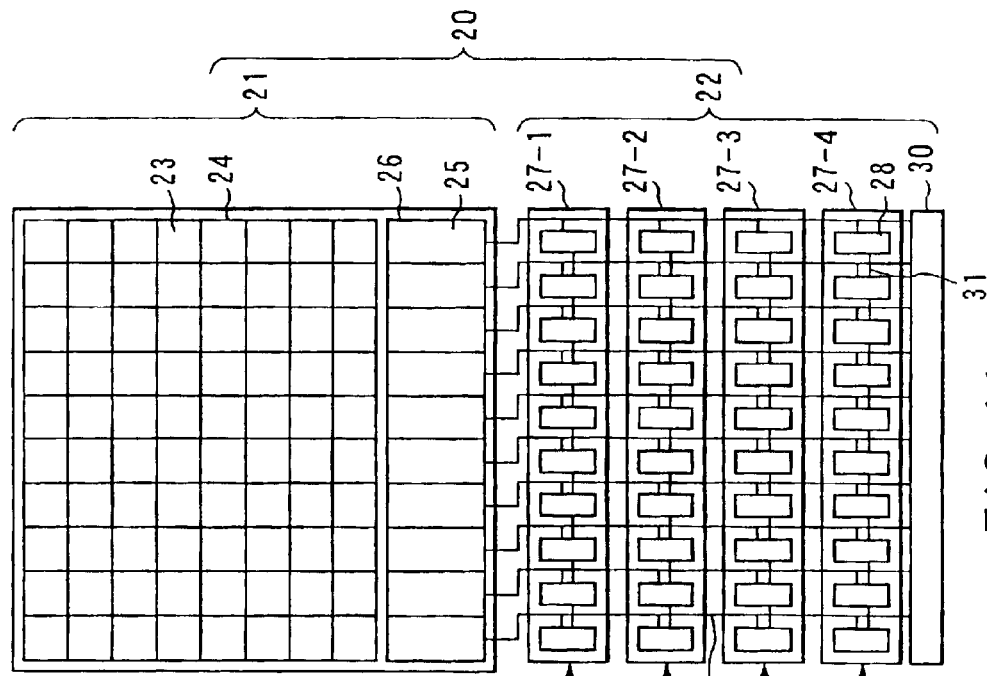
FIG. 11 is a diagram showing another specific example of the wirings according to the fifth embodiment.

FIG. 11 is a diagram showing another specific example of the wirings 29 according to the fifth embodiment. In this example, in the same manner as in FIG. 6, each of the wirings 29 is provided to be extended in the column direction in the signal processing section 22, and each PE 28 is connected to the corresponding wiring 29 in the vicinity thereof.

In FIG. 11, the wirings 29 are connected to a signal output circuit 30. The result of a processing obtained by the signal processing section 22 is output from the signal output circuit 30 to the outside of the chip. The signal output circuit 30 may also be provided in FIGS. 9 and 10.

Figure 12:
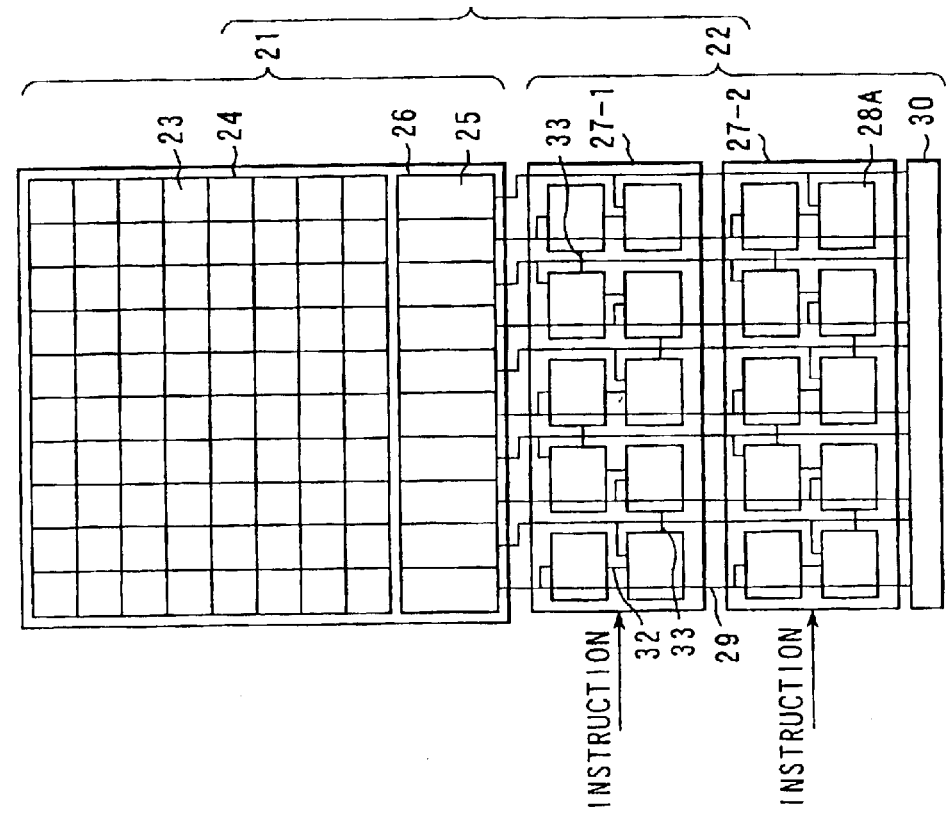
FIG. 12 is a diagram showing the structure of an image input system (an image input chip) formed into one chip according to a sixth embodiment of the present invention.

FIG. 12 shows the structure of an image input system (an image input chip) formed into one chip according to a sixth embodiment of the present invention.

In the present embodiment, two processors 27-1 and 27-2 are provided in a signal processing section 22. In each processor, a plurality of (eight in the present embodiment) PEs 28A are arranged two-dimensionally in two rows and a plurality of columns and the number of the columns of the PEs 28A is half of the number of columns of a pixel 23 of an array of pixel 24 in the same manner as in FIG. 7. Accordingly, the array width in the column direction of each of the PEs 28 is substantially twice as great as the array width in the column direction of the pixel 23 of the array of pixel 24.

The wirings 29 are provided to be extended in the column direction in the signal processing section 22, and each PE 28A is connected to the corresponding wiring 29 in the vicinity thereof.

In the processors 27-1 and 27-2, furthermore, a wiring 32 for connecting two PEs 28A in different rows and the same column and a wiring 33 for connecting two PEs 23 adjacent to each other in the same row are provided to transfer data between the PEs 28A provided in each of the processors 27-1 and 27-2.

By these wirings 32 and 33, a plurality of PEs 28 provided in two rows and a plurality of columns in each of the processors 27-1 and 27-2 are mutually connected so that all the PEs 28A in the same processor can mutually transfer a signal.

Thus, at least one of the two wirings 32 and 33 can have a wiring length decreased and the scale of a driving circuit for driving the wiring can be reduced. Consequently, the area occupied by the circuit and power to be consumed can be reduced.

Figure 13:
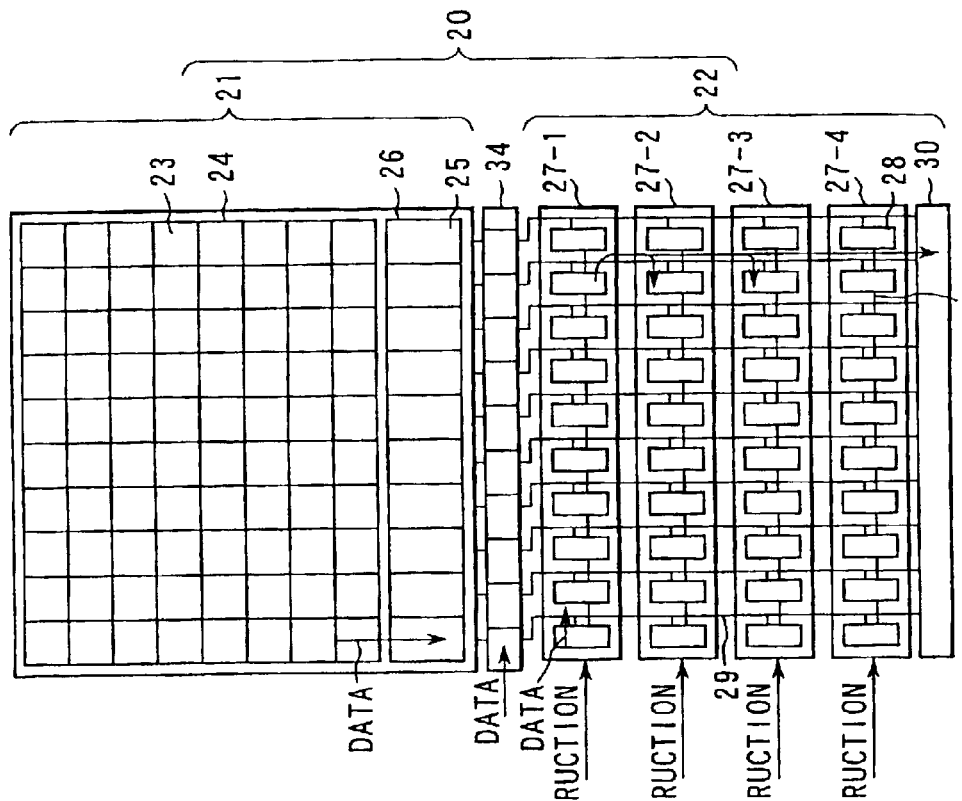
FIG. 13 is a diagram showing the structure of an image input system (an image input chip) formed into one chip according to a seventh embodiment of the present invention.

FIG. 13 shows the structure of an image input system (an image input chip) formed into one chip according to a seventh embodiment of the present invention.

In the present embodiment, in the same manner as in the fifth embodiment shown in FIG. 11, a signal processing section 22 is provided with four processors 27-1 to 27-4 in which a plurality of PEs 28 are arranged in one row and a plurality of columns. Moreover, a plurality of wirings 29 are provided to be extended in the column direction in the signal processing section 22, each PE 28 in each of the processors 27-1 to 27-4 is connected to a corresponding one of the wirings 29 in the vicinity thereof, and furthermore, the PEs 28 in each of the processors 27-1 to 27-4 are mutually connected through each wiring 31.

In the present embodiment, moreover, a signal input circuit 34 is provided between an image input section 21 and a signal processing section 22 in the middle of the paths of the wirings 29, for example. The signal input circuit 34 can be constituted by a shift register having the same number of bits (10 bits in the present embodiment) as the number of pixels 23 for one column of the array of pixel 24, and a signal input from the outside is output to the wirings 29 in parallel.

With such a structure, a signal (data) can be output from the image input section 21, the signal input circuit 34 or one of the four processors to the wirings 29, and a signal can be simultaneously input from the wirings 29 to one or more of the four processors 27-1 to 27-4, and furthermore, to the signal output circuit 30. Moreover, a signal can be mutually transferred through a wiring 31 in the PEs 28 belonging to the same processor.

Figure 14:
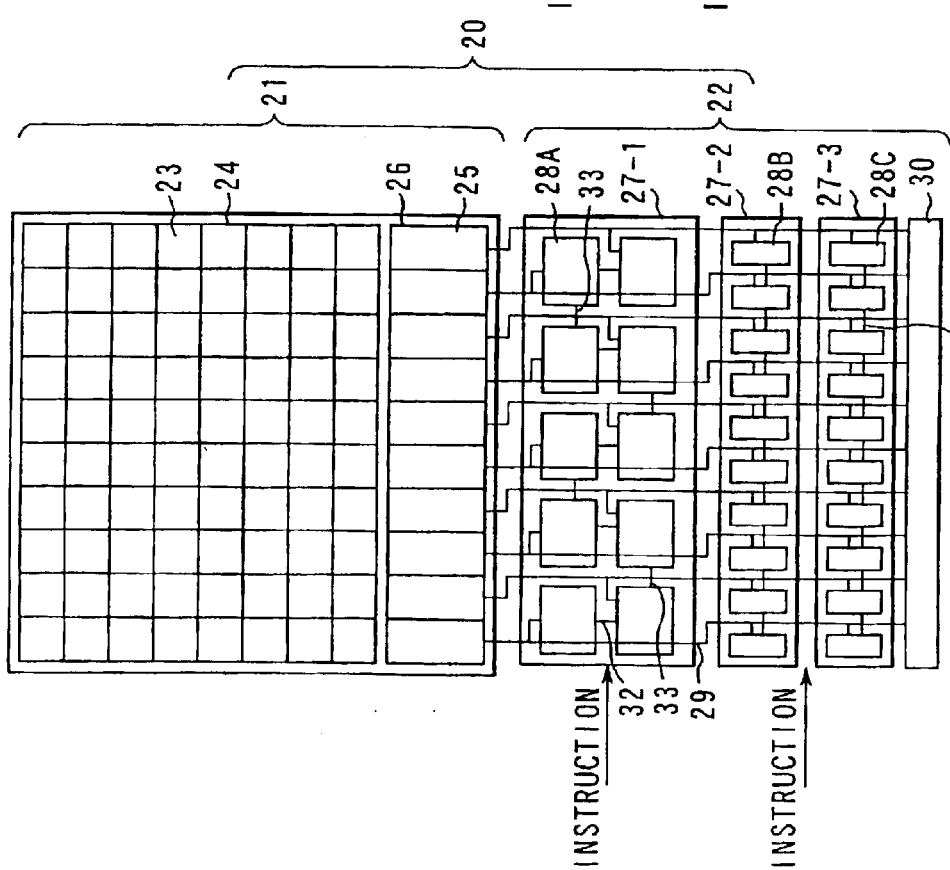
FIG. 14 is a diagram showing the structure of an image input system (an image input chip) formed into one chip according to an eighth embodiment of the present invention.

FIG. 14 shows the structure of an image input system (an image input chip) formed into one chip according to an eight embodiment of the present invention.

In the present embodiment, a plurality of (three in the present embodiment) processors 27-1 to 27-3 are provided in a signal processing section 22. The structures of a plurality of PEs 28A provided in the processor 27-1, the structures of a plurality of PEs 28B provided in the processor 27-2 and the structures of a plurality of PEs 28C provided in the processor 27-3 are the same in the same processor respectively, while the structures of the PEs are different in the different processors.

Thus, the signal processing section 22 can be optimum by properly changing the structure of the PE provided in the processor depending on the contents of a signal processing.

Figure 15:
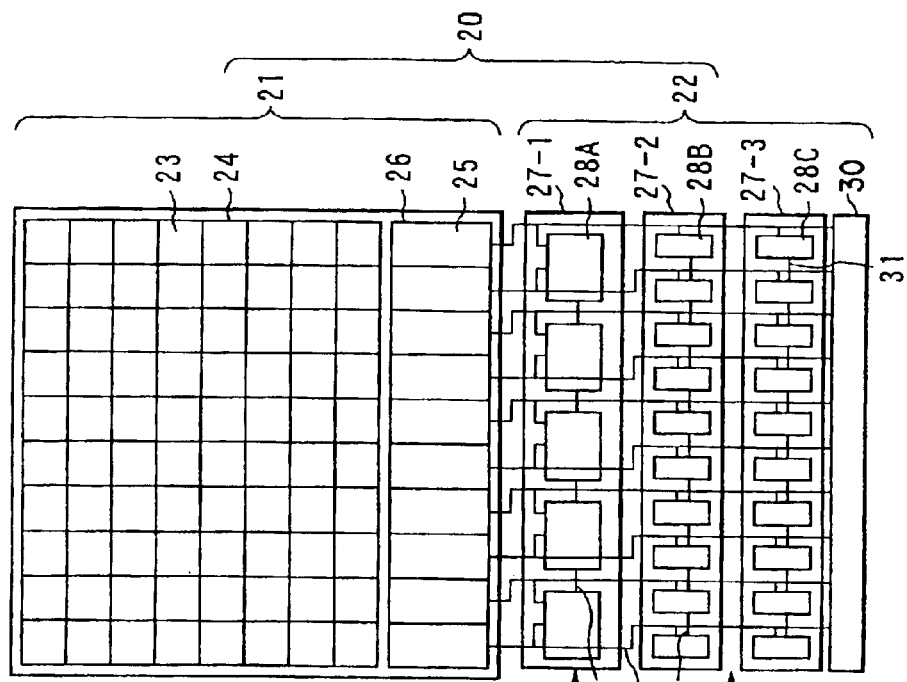
FIG. 15 is a diagram showing the structure of an image input system (an image input chip) formed into one chip according to a ninth embodiment of the present invention.

FIG. 15 shows the structure of an image input system (an image input chip) formed into one chip according to a ninth embodiment of the present invention.

In the present embodiment, a plurality of (three in the present embodiment) processors 27-1 to 27-3 are provided in a signal processing section 22. In the processor 27-1, PEs 28A having the half number (five in the present embodiment) of the number of pixels 23 for one row of an array of pixel 24 are provided in one row and a plurality of columns (five columns in the present embodiment). The array width in the column direction of each PE 28A in the processor 27-1 is substantially twice as great as the array width of the pixel 23 in the column direction of the array of pixel 24.

In other processors 27-2 and 27-3, the same number of (ten in the present embodiment) PEs 28A or PEs 28B as the number of the pixels 23 for one row of the array of pixel 24 are arranged in one row and a plurality of columns. Accordingly, the array width in the column direction of each PE in both of the processors 27-2 and 27-3 is substantially equal to the array width of the pixel 23 in the column direction of the array of pixel 24.

In the present embodiment, although only the PEs having a half of the number of the pixels 23 for one row of the array of pixel 24 are provided in the processor 27-1, two adjacent wirings 29 are connected to each PE 28A and one PE 28A is shared for the pixels 23 for two columns.

Figures 16, 17:
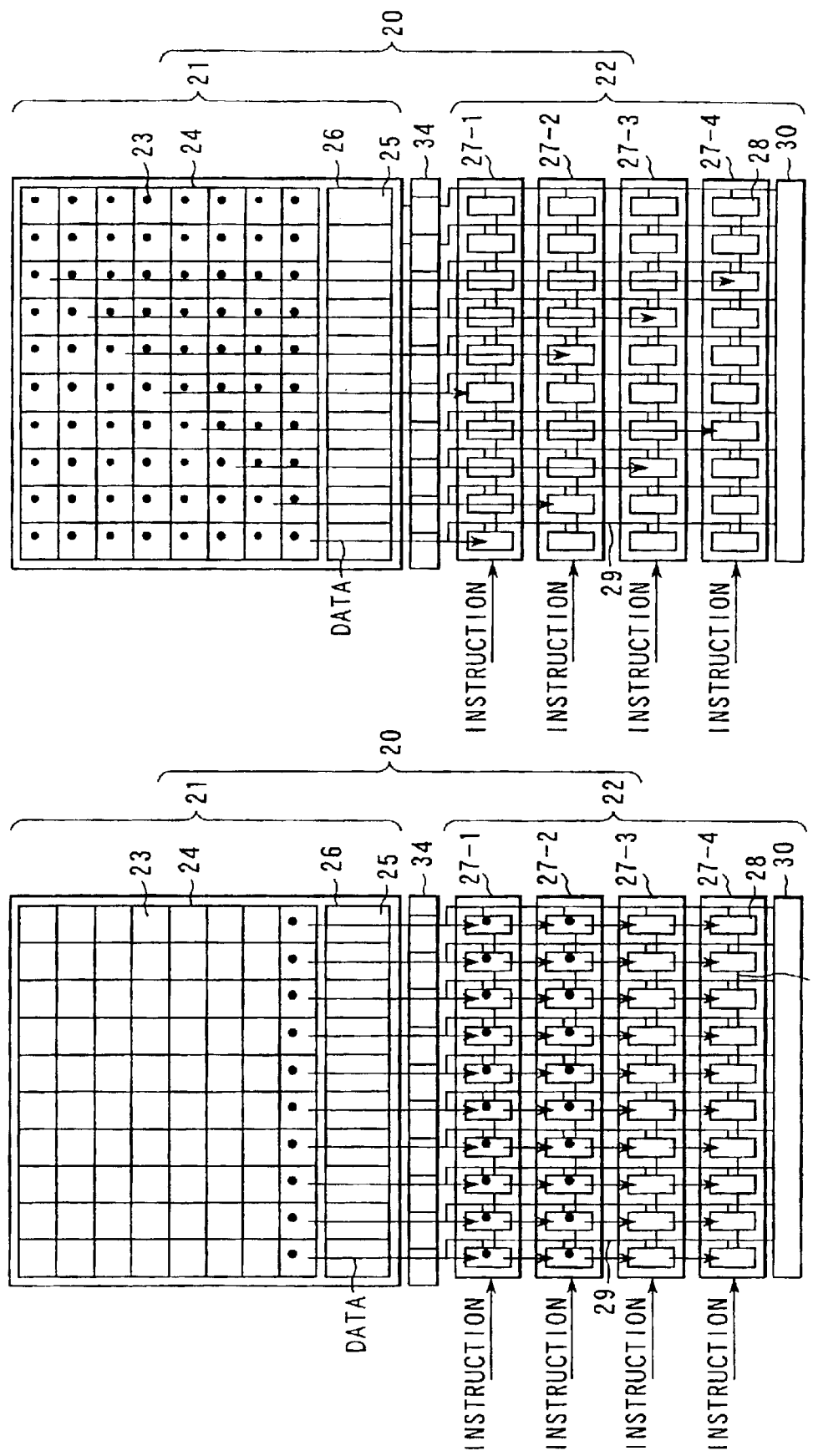
FIG. 16 is a diagram showing an example of a method for operating the image input chip illustrated in FIG. 13.
FIG. 17 is a diagram showing an example of a method for operating the image input chip illustrated in FIG. 13 which is different from the above-mentioned operating method.

FIG. 16 shows an example of a method for operating an image input chip shown in FIG. 13. Incident light is converted into an analog signal by each of the pixels 23 in the image input section 21. The analog signal thus obtained by the conversion is sequentially A/D-converted in a row unit in order of a first row, a second row, a third row, . . . , of the array of pixel 24 in the data read-out circuit 26. The digital signal obtained by the conversion in the data read-out circuit 26 is sequentially output to the signal processing section 22 through each of the wirings 29. In the signal processing section 22, the four processors 27-1 to 27-4 share the signal processing. First of all, a signal in the first row of the array of pixel 24 is input to the processor 27-1 where a signal processing is carried out in parallel by a plurality of PEs 28. The result of the processing carried out by the processor 27-1 is input to the next processor 27-2 through each of the wirings 29 again, and the signal processing is carried out in parallel by the PEs 28 in the processor 27-2. In the same manner, subsequently, the result of the processing carried out by each processor is sent to the next processor where a next signal processing is carried out. The results of the processings completed by all the processors are output to the outside of the chip through the signal output circuit 30.

In the same manner as described above, moreover, signals in the second row, the third row, . . . of the array of pixel 24 which are converted by the data read-out circuit 26 are processed in order from the processor 27-1.

FIG. 17 shows an example of a method for operating an image input chip shown in FIG. 13 which is different from the above-mentioned operating method. Also in this example, the A/D conversion is sequentially carried out in a row unit in order of the first row, the second row, the third row, . . . of the array of pixel 24 in the data read-out circuit 26, and a digital signal obtained by the conversion in the data read-out circuit 26 is sequentially output to the signal processing section 22 through each of the wirings 29. A signal of the first row of Array of Pixel 24 is input to the processor 27-1, and a signal of the second row to the processor 27-2. Similarly, signals of up to the fourth row are input to up to the processor 27-4. On the other hand, signal of the fifth and the following rows are successively input to the processors 27-1 to 27-4 once again. Parallel signal processing is carried out by plural PE 28 in the respective processors. The processing result from each processor, 27-1 to 27-4, is input to at least one of the other processors. When signal processing is performed in each processor, the processing result of some other processor can be used. In this manner, subsequently, each processor receives a signal from the data read-out circuit 26 and the results of the processings sent from other processors, and carries out the processing by using these signals. The results of the processings completed by all the processors are output to the outside of the chip through a signal output circuit 30.

In the operating method described with reference to FIG. 17, in the case in which the result of the processing carried out by one processor is to be sent to another processor, the results of the processings carried out in all the PEs 28 in one processor may be transmitted to all the PEs 28 in another processor in parallel.

Figure 18:
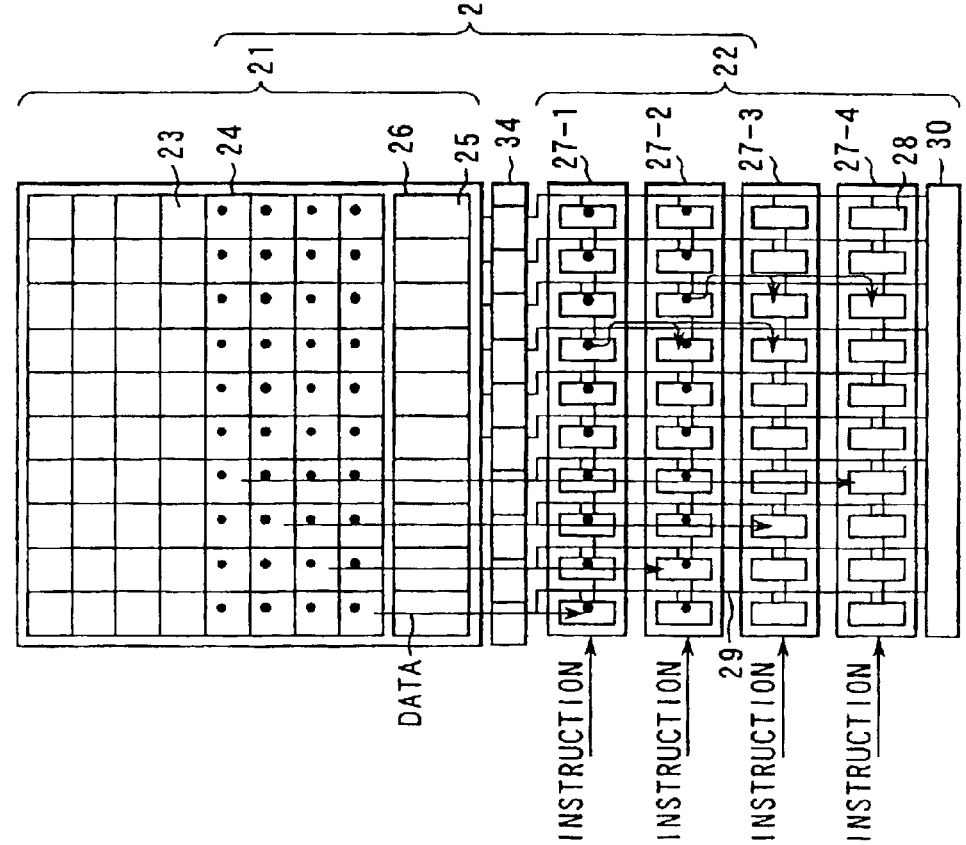
FIG. 18 is a diagram showing an example of a method for operating the image input chip illustrated in FIG. 13 which is further different from the above-mentioned operating method.

In the operating method shown in FIG. 18, for example, the results of the processing carried out in the PEs 28 of the processor 27-1 are sent to the PEs 28 in the processors 27-2 and 27-3 respectively, and furthermore, the results of the processings carried out in the PEs 28 of the processor 27-2 are sent to the PEs 28 in the processors 27-3 and 27-4 respectively.

Figure 19:
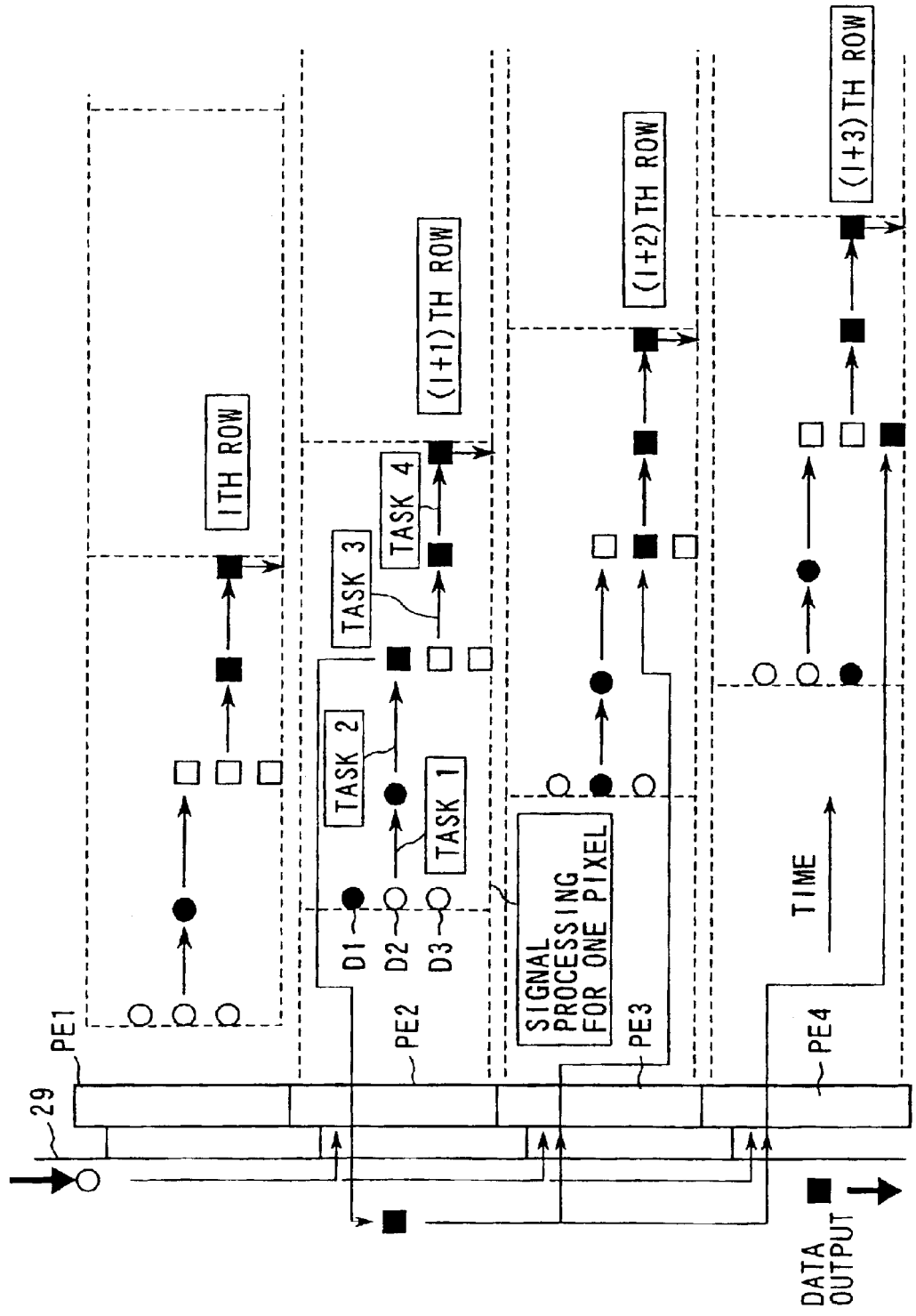
FIG. 19 is a diagram showing an example of a processing flow obtained when the signal processing of image data is to be actually carried out by the method illustrated in FIG. 18.

FIG. 19 shows an example of a processing flow for actually carrying out the signal processing of pixel data by the method shown in FIG. 17 and/or FIG. 18. In FIG. 19, PE 1, PE 2, PE 3 and PE 4 represent the PEs 28 in the corresponding column positions in the processors 27-$i$ to 27-($i$+3) ($i$ is an optional positive integer). A signal in the ith row of the array of pixel 24 which is converted into a digital signal is sent in parallel to the PE 2, the PE 3 and PE 4 through the wiring 29. When signals (pixel data) D1, D2 and D3 for three rows comprising ($i$−1)th, ith and ($i$+1)th rows are gathered in the processor 27-($i$+1) including the PE 2, a signal processing is carried out by using the signals for three rows (task 1). During this signal processing, a signal may be received through the wiring 31 from another PE in the same processor 27-($i$+1). The task 1 implies a color interpolation processing, for example. When the task 1 is completed, a next signal processing is subsequently carried out in the PE 2 (task 2). The task 2 implies a color correction processing, for example. The result in progress obtained at the time of the completion of the task 2 is output to the wiring 29. If necessary, the processors 27-($i$+2) and 27-($i$+3) receive, from the wiring 29, a signal indicative of the result in progress obtained when the task 2 in the processor 27-($i$+1) is completed, respectively.

When the results in progress for three rows are gathered in the processor 27-($i$+1), a signal processing is carried out by using signals for the three rows (task 3). The task 3 is a differential processing in (3×3) pixel regions in the array of pixel 24, for example. When the task 3 is completed, a signal processing is carried out in the PE 2 (task 4). The task 4 implies a color space conversion, for example.

When the task 1 to the task 4 are carried out, all the signal processings for one pixel are completed. The result is output to the wiring 29. Thus, the signal processing of the pixel data is sequentially carried out in time difference by the PEs.

Moreover, the signals can be freely received and transmitted mutually between the processors by using the wiring 29. Therefore, the processors can be operated efficiently. As a result, a signal processing speed can be increased.

Figure 3B:
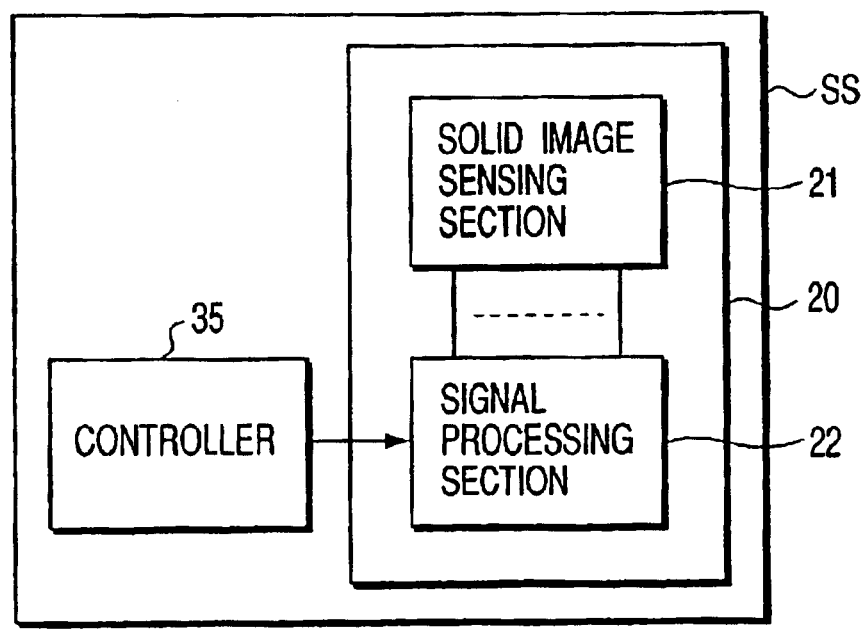
Figure 20:
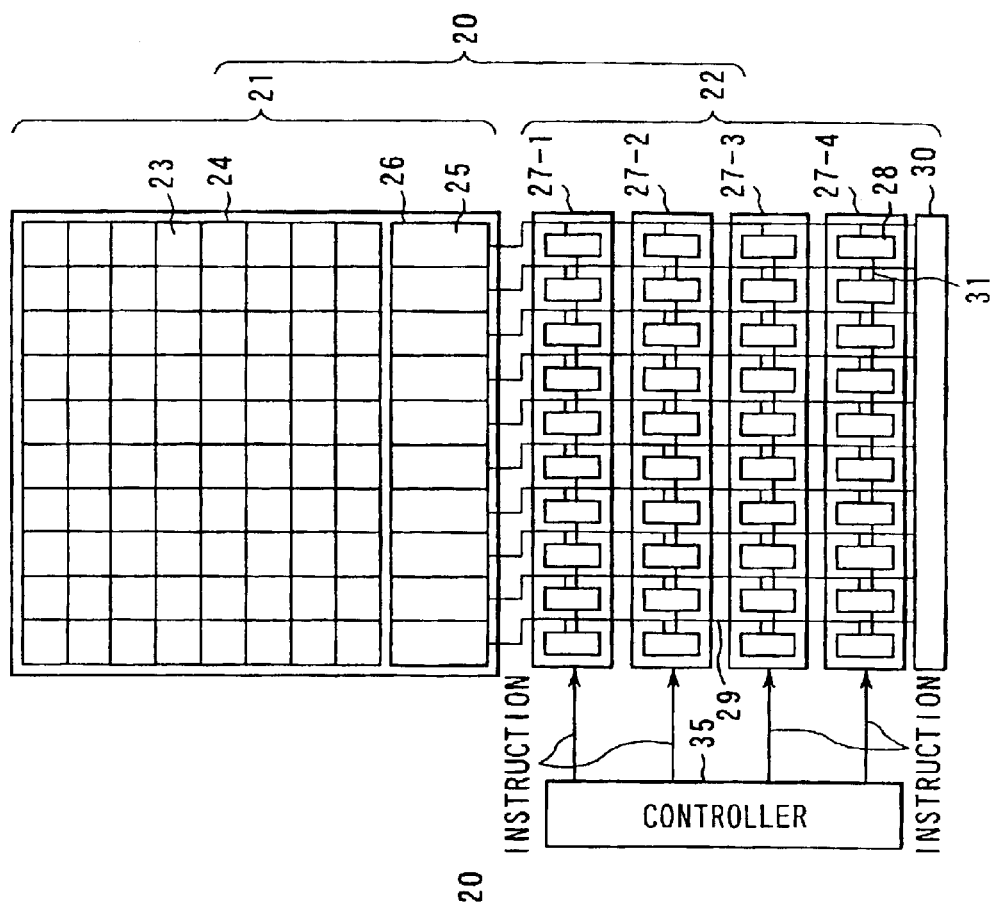
FIG. 20 is a diagram showing a specific example in which control signals (instruction) are to be input to the image input chip illustrated in FIG. 11.

FIG. 20 shows a specific example in which the control signal (instruction) is input to the signal processing section 22 having the four processors 27-1 to 27-4 in which the PEs 28 are arranged in one row and a plurality of columns respectively as shown in FIG. 11. The control signals (instructions) which are generated by a controller 35 and are different from each other are independently input to the four processors 27-1 to 27-4, respectively. The image input chip 20 and the controller 35 are wholly integrated on a semiconductor substrate SS as shown in FIG. 3B.

Figures 21, 22:
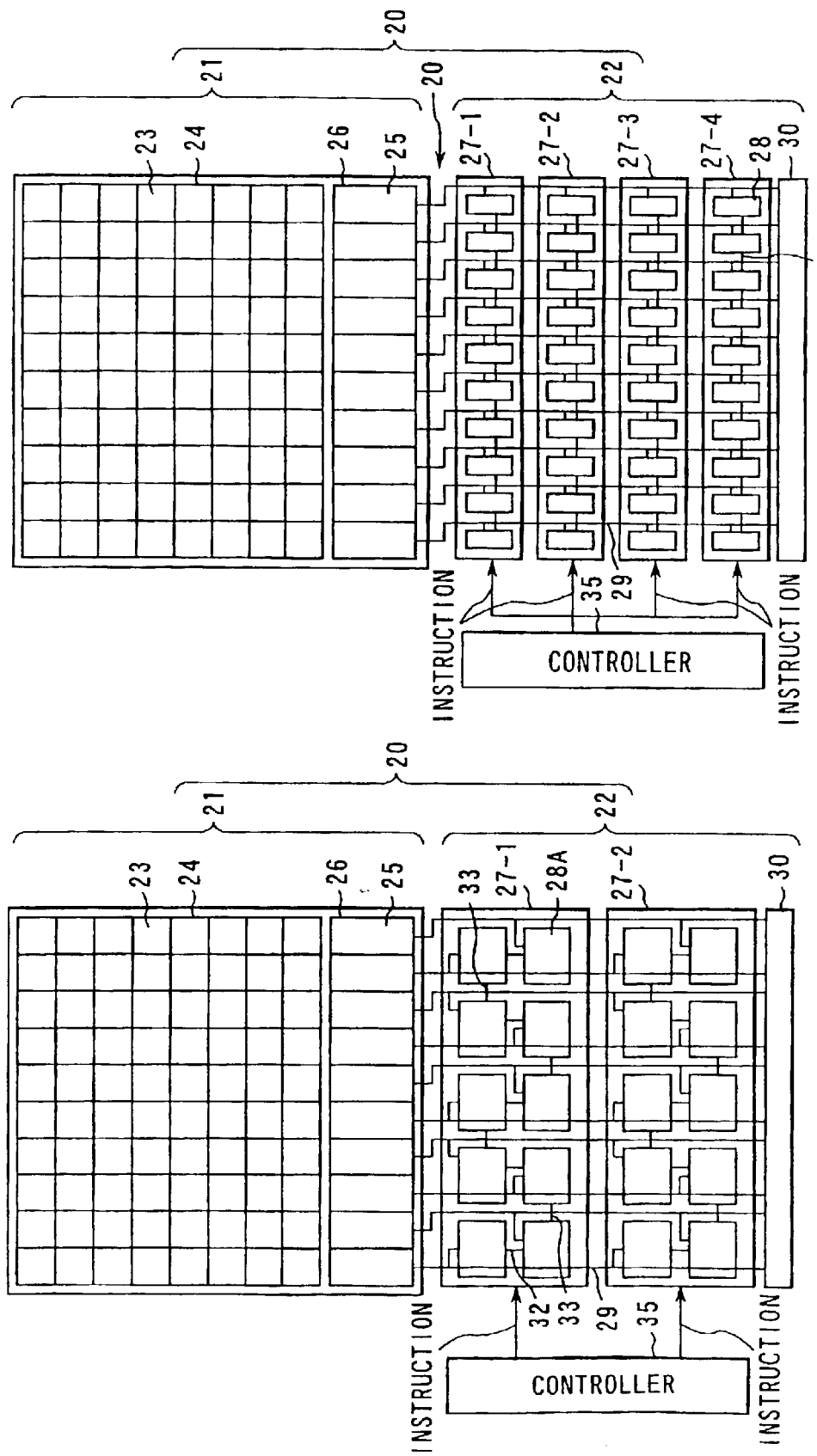
FIG. 21 is a diagram showing a specific example in which control signals (instruction) are to be input to the image input chip illustrated in FIG. 12.
FIG. 22 is a diagram showing a specific example in which control signals (instruction) are to be input to the image input chip illustrated in FIG. 11.

FIG. 21 shows a specific example in which the control signal (instruction) is input to the signal processing section 22 having two processors 27-1 and 27-2 in which the PEs 28A are arranged in two rows and a plurality of columns respectively as shown in FIG. 12. The control signals (instructions) which are generated by the controller 35 and are different from each other are independently input to the two processors 27-1 and 27-2, respectively.

FIG. 22 shows a specific example in which the control signal (instruction) is input to the signal processing section 22 having the four processors 27-1 to 27-4 in which the PEs 28 are arranged in one row and a plurality of columns respectively as shown in FIG. 11. The control signal (instruction) generated by the controller 35 is input in parallel to the four processors 27-1 to 27-4.

Figure 23:
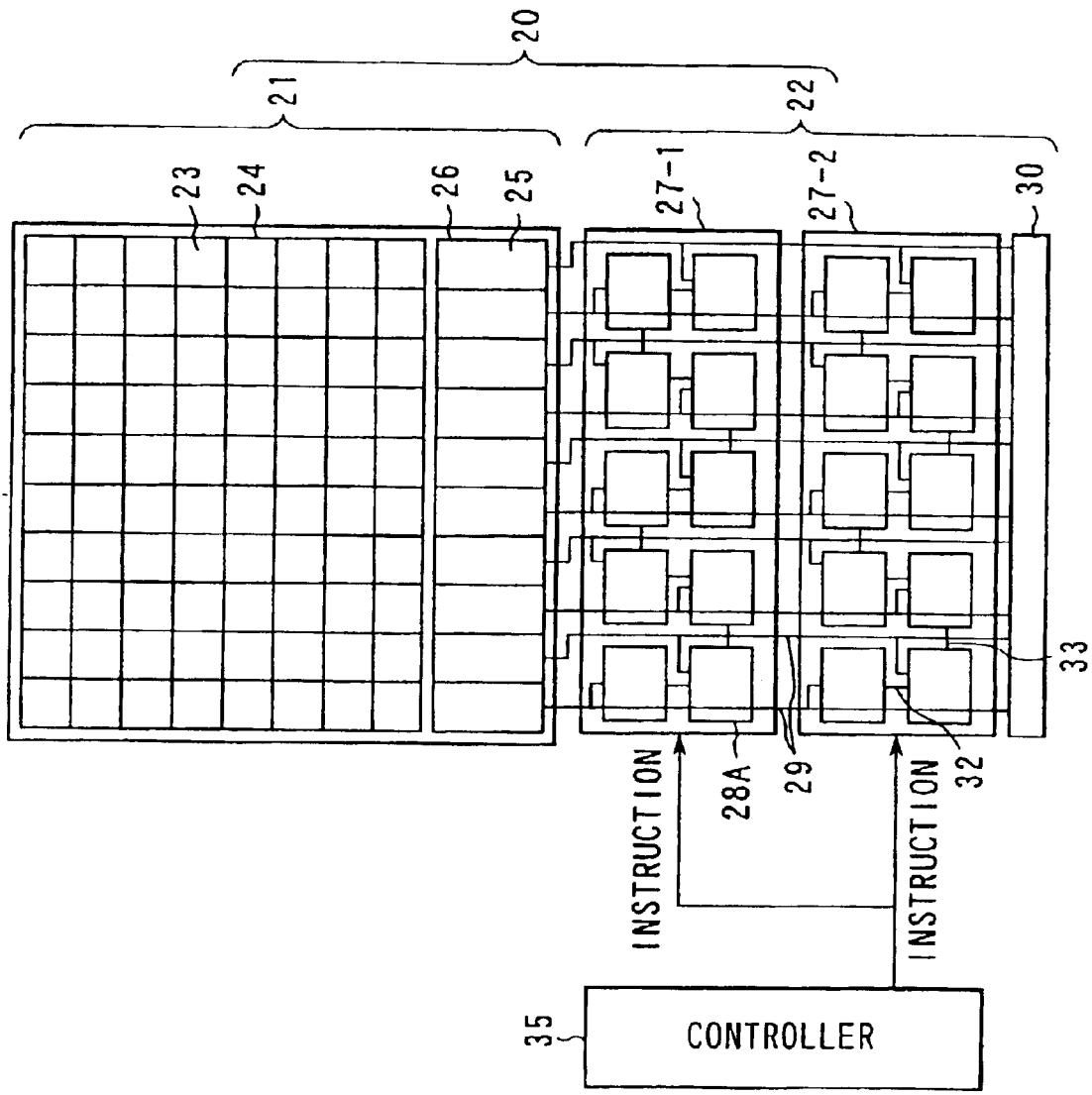
FIG. 23 is a diagram showing a specific example in which a control signal (an instruction) is to be input to the image input chip illustrated in FIG. 12.

FIG. 23 shows a specific example in which the control signal (instruction) is input to the signal processing section 22 having the two processors 27-1 and 27-2 in which the PEs 28A are arranged in two rows and a plurality of columns respectively as shown in FIG. 12. The control signal (instruction) generated by the controller 35 is input in parallel to the two processors 27-1 to 27-2.

Thus, the different control signals may be independently input to the processors and the same control signal may be input in parallel.

Figure 24:
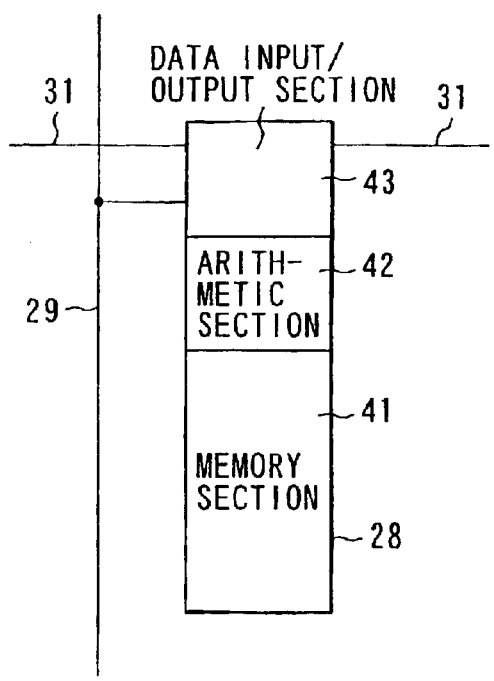
FIG. 24 is a diagram showing an example of the schematic structure of a PE to be used in each of the embodiments.

FIG. 24 shows an example of the schematic structure of the PE 28 to be used in each of the above-mentioned embodiments. The PE 28 is roughly divided into three circuit blocks including a memory section 41 for storing data, an arithmetic section 42 for carrying out a data processing and a data input/output section 43, the wiring 29 extended in the column direction and the wiring 31 which is connected to the data input/output section 43 connecting the PEs 28 in the same processor.

Figure 25:
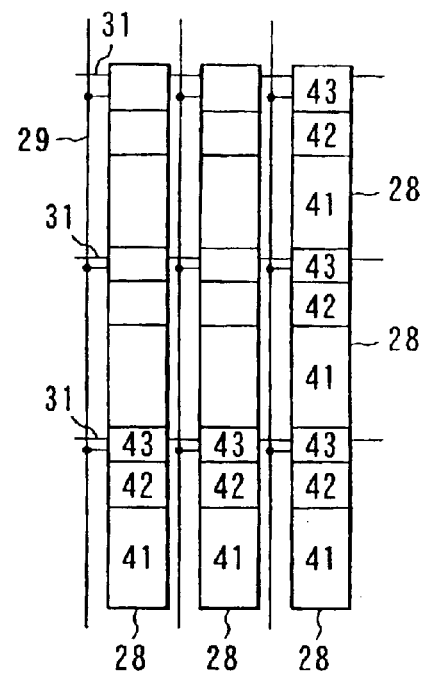
FIG. 25 is a diagram showing an example of the arrangement of a plurality of PEs in a signal processing section having PEs provided therein as illustrated in FIG. 24.

FIG. 25 shows an example of the arrangement of the PEs 28 in the signal processing section 22 in which a plurality of PEs 28 shown in FIG. 24 are provided. The PEs 28 provided in each column are connected to the same wiring 29.

Figure 26:
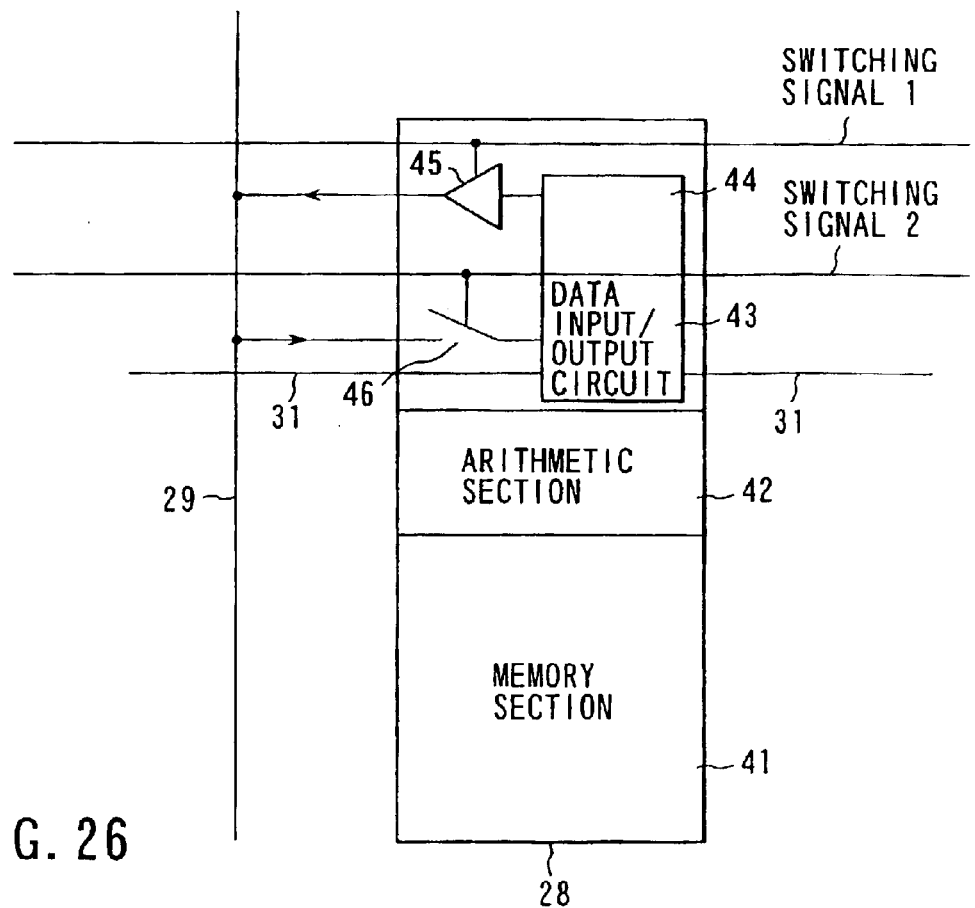
FIG. 26 is a diagram more specifically showing a data input/output section in the PE illustrated in FIG. 24.

FIG. 26 is a diagram more specifically showing the data input/output section 43 in the PE 28 illustrated in FIG. 24. The data input/output section 43 has a data input/output circuit 44, a 3-state buffer 45 for inputting data output from the data input/output circuit 44 and giving an output to the wiring 29, and a switch 46 for fetching data which is connected between the wiring 29 and the data input/output circuit 44. The operation of the 3-state buffer 45 is controlled in response to a switching signal 1, and an output takes one of a logic 0 state, a logic 1 state and a high impedance state, and a signal can be output from the 3-state buffers to one of the wirings 29. The operation of the switch 46 is controlled in response to a switching signal 2, and data are fetched from the wiring 29 to each PE 28 through the switch 46. By conducting the switch 46, the PE 28 can fetch a necessary one of signals (data) transferred to the wiring 29. Moreover, such a switch 46 is provided in all the PEs 28. Therefore, the PEs 28 can fetch the same data.

The switching signal 1 for controlling the 3-state buffer 45 and the switching signal 2 for controlling the switch 46 are a part of the control signals to be input to the processor 27.

With such a structure, the degree of freedom of signal input and output between the PEs 28 and the signal output circuit 30 can be increased in the signal processing section 22, and a signal can be transmitted very efficiently therebetween and a signal processing can be carried out efficiently.

Figure 27:
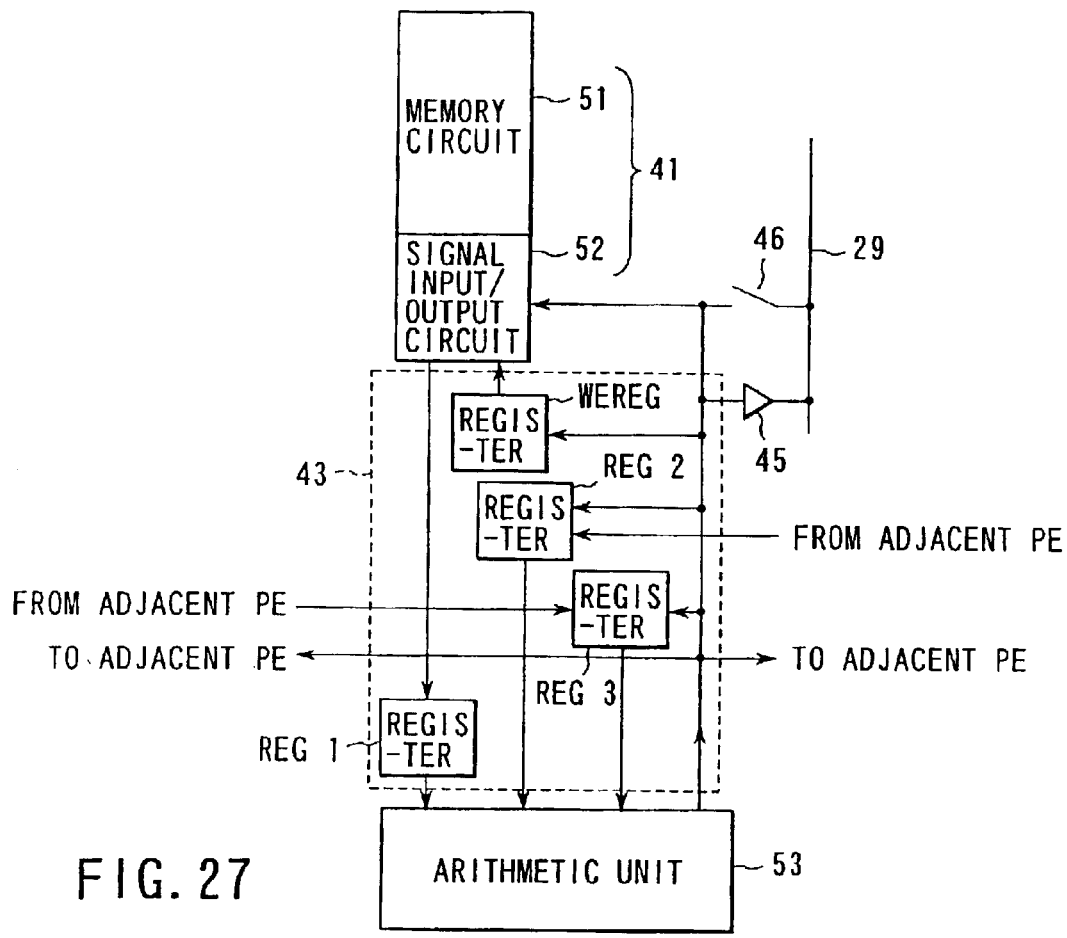
FIG. 27 is a diagram showing a further example of the structure of the PE.

It is proposed that the structure shown in FIG. 27 is used as the PE 28 shown in FIG. 26, for example. More specifically, FIG. 27 shows a specific example of the PE 28. The memory section 41 includes a memory circuit 51 of a random access type and a signal input/output circuit 52. The arithmetic section 42 includes an arithmetic unit 53. Furthermore, the data input/output circuit 43 includes three registers REG 1, REG 2 and REG 3 and one write enable register WEREG.

As an example of a signal processing to be carried out in the PE having such a structure, description will be given to the case in which two kinds of 4-bit data A0 to A3 and B0 to B3 stored in the memory circuit 51 are added. The operation is carried out from a low order bit every bit. First of all, a write enable signal is sent from the arithmetic unit 53 to a write enable register WEREG and the write of the memory circuit 51 is enabled. Then, data A0 is read from the memory circuit 51 and is sent to the register REG 1. Subsequently, the contents of the register REG 1 are sent to the register REG 2 through the arithmetic unit 53. Then, data B0 is read from the memory circuit 51 and is sent to the register REG 1. Thereafter, the contents of the register REG 1 and the register REG 2 are added by the arithmetic unit 53, and the result of the addition is output from the arithmetic unit 53. The output data are sent to the signal input/output circuit 52 of the memory section 41 and are then written to the memory circuit 51. Subsequently, carry data are calculated by the arithmetic unit 53 by using the contents of the registers REG 1 and REG 2, and are sent to the register REG 3. Then, data A1 is read from the memory circuit 51 and is sent to the register REG 1. Thereafter, the contents of the register REG1 are sent to the register REG2 through the arithmetic unit 53. Subsequently, data B1 is read from the memory circuit 51 and is sent to the register REG 1. Then, the contents of the registers REG 1, REG 2 and REG 3 are added by the arithmetic unit 53 and the result of the addition is output from the arithmetic unit 53. The output data are sent to the signal input/output circuit 52 of the memory section 41 and are written to the memory circuit 51. In the same manner, subsequently, two kinds of 4-bit data A0 to A3 and B0 to B3 are added by performing the operation of high order bits.

Figure 28:
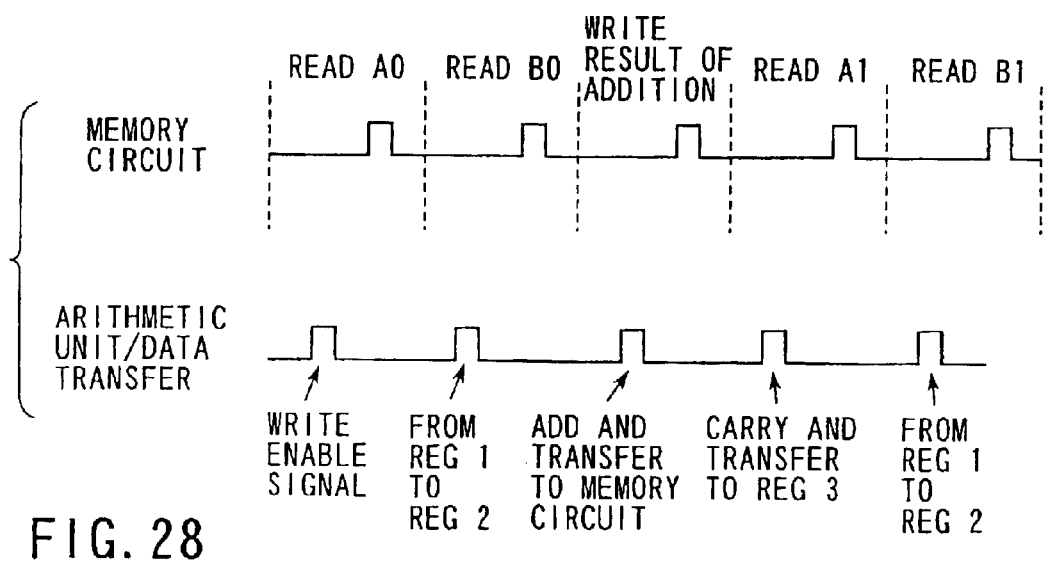
FIG. 28 is a timing chart typically showing a data writing and reading timing in a memory circuit, an operating timing of an arithmetic unit and a data transfer timing which are obtained when addition is to be carried out by the PE illustrated in FIG. 27.

FIG. 28 typically shows a data writing and reading timing in the memory circuit 51, an operating timing of the arithmetic unit 53 and a data transfer timing which are obtained when addition is to be carried out by the PE illustrated in FIG. 27. The operation shown in FIG. 28 is obtained as shown in the following Table 1.

TABLE 1

| Operating cycle | Arithmetic unit/data transfer | Memory circuit |
| --- | --- | --- |
| 1 | Write enable signal to register WEREG | Read A0 |
| 2 | A0 from REG 1 to REG 2 | Read B0 |
| 3 | Addition (REG 1 + REG 2) | Write result of addition |
| 4 | Carry (REG 1, REG 2) to REG 3 | Read A1 |
| 5 | A1 from REG 1 to REG 2 | Read B1 |
| 6 | Addition (REG 1 + REG 2 + REG 3) | Write result of addition |
| 7 | Carry (REG 1 to REG 3) to REG 3 | Read A2 |
| 8 | A2 from REG 1 to REG 2 | Read B2 |
| 9 | Addition (REG 1 + REG 2 + REG 3) | Write result of addition |
| 10 | Carry (REG 1 to REG 3) to REG 3 | Read A3 |
| 11 | A3 from REG 1 to REG 2 | Read B3 |
| 12 | Addition (REG 1 + REG 2 + REG 3) | Write result of addition |
| 13 | Carry (REG 1 to REG 3) to REG 3 | Write result of carry |

In the case in which data in the memory circuit 51 are to be transferred to the adjacent PE, the following operation is carried out. Data C0 is transmitted from the memory circuit 51 to the signal input/output circuit 52 through the register REG 1. Subsequently, the contents of the register REG 1 are sent through the arithmetic unit 53 to the register REG 2 or the register REG 3 in two or more adjacent PEs. The contents of the register REG 1 are transmitted to the REG 2 in another PE which is positioned on the left side in the drawing for the shown PE and are transmitted to the REG 3 in another PE which is positioned on the right side in the drawing for the shown PE. In the PE to which the data are transmitted, then, the contents of the register REG 2 or REG 3 are written to the corresponding memory circuit 51 through the arithmetic unit 53 provided in each PE.

Figure 29:
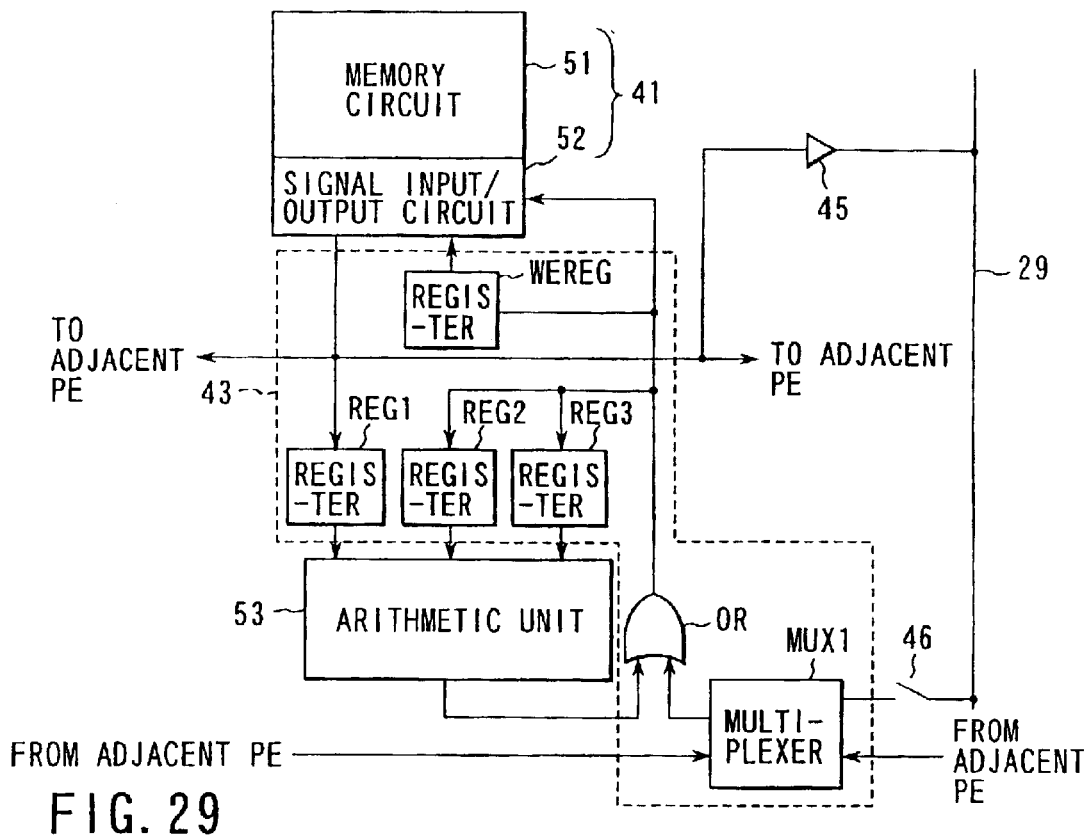
FIG. 29 is a diagram showing another example of the structure of the PE.

Moreover, it is also supposed that the structure shown in FIG. 29 is used as the PE 28 shown in FIG. 26, for example. More specifically, FIG. 29 shows another specific example of the PE 28 shown in FIG. 26. The PE 28 shown in FIG. 29 is different from the PE shown in FIG. 27 in that the data input/output circuit 43 has different structures. In this case, the three registers REG 1, REG 2 and REG 3 and one write enable register WEREG are provided and an OR circuit OR and a multiplexer MUX1 are newly added in the data input/output circuit 43.

In the PE shown in FIG. 29, the data output from the arithmetic unit 53 and data transferred from the adjacent PE through the multiplexer MUX1 are input to the signal input/output circuit 52 of the write enable register WEREG or the memory section 41 through the OR circuit OR. Moreover, the data transferred to the adjacent PE is output from the signal input/output circuit 52 of the memory section 41.

However, the PEs having the structures shown in FIGS. 27 and 29 have the following problems. More specifically, a signal processing speed in each PE is not determined by the signal processing speed of the arithmetic unit 53 but is determined by the number at which the data are read from the memory circuit 51 or the number at which the data are written to the memory circuit 51, which is the constraint of the signal processing speed. In other words, the signal processing speed of the PE is determined by a band width between the memory circuit 51 and the arithmetic unit 53. In the PE having such a structure as to read and write data for one bit illustrated in the Table 1, the band width cannot be increased between the memory circuit 51 and the arithmetic unit 53 in principle, which is the determinative cause by which the signal processing speed cannot be increased in such a PE.

Figure 30:
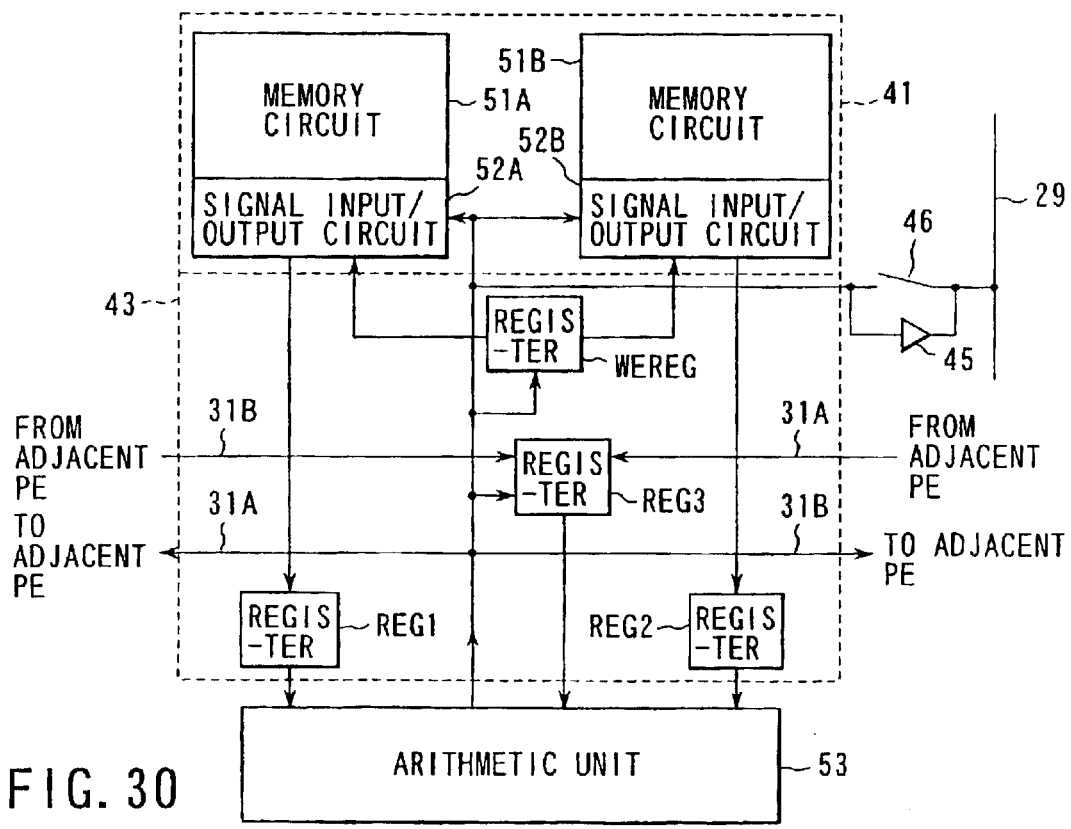
FIG. 30 is a diagram showing an example of the specific structure of the PE to be used in the present invention.

In the present invention, the structure shown in FIG. 30 is used as the PE, for example. In the PE shown in FIG. 30, the memory circuit 51 in the PE shown in FIG. 27 is divided into two memory circuit blocks 51A and 51B. For these two memory circuit blocks 51A and 51B, signal input/output circuits 52A and 52B corresponding to the signal input/output circuit 52 are provided for the two memory circuit blocks 51A and 51B, respectively. Differently from the case shown in FIG. 27, furthermore, the output node of the write enable register WEREG is connected to each of the input nodes of the two signal input/output circuits 52A and 52B, and the input node of the register REG 2 is connected to the data output node of the signal input/output circuit 52B on the memory circuit block 51B. The input node of the register REG 1 is connected to the data output node of the signal input/output circuit 52A on the memory circuit block 51A, the output node of the arithmetic unit 53 is connected to the input node of the register REG 3, a wiring 31A on which data are transferred from another PE positioned on the left side in the drawing is connected to the shown PE, and a wiring 31B on which data are transferred from another PE positioned on the right side in the drawing is connected to the shown PE. The output node of the register REG 3 is connected to the input node of the arithmetic unit 53. Furthermore, the output node of the arithmetic unit 53 is connected to each of the data input nodes of the signal input/output circuits 52A and 52B, the input node of the write enable register WEREG and the input node of the register REG 3 respectively, and to the input node of the register REG 3 in another PE positioned on the left side in the drawing through the wiring 31B and to the input node of the register REG 3 in another PE positioned on the right side in the drawing through the wiring 31A.

As an example of a signal processing in the PE having such a structure, description will be given to the case in which the two kinds of 4-bit data A0 to A3 and B0 to B3 are added. Data to be stored in the memory circuit 51 in FIG. 27 are divided into two sets which will be stored in the two memory circuit blocks 51A and 51B. For example, one of the memory circuit blocks, 51A, stores even-bit data A0 and A2 of one of two kinds of 4-bit data, i.e. A0 to A3, as well as odd-bit data B1 and B3 of the other kind of 4-bit data B0 to B3. The other memory circuit block 51B stores odd-bit data A1 and A3 of the one kind of 4-bit data, i.e. A0 to A3, as well as even-bit data B0 and B2 of the other kind of 4-bit data B0 to B3.

Figure 31:
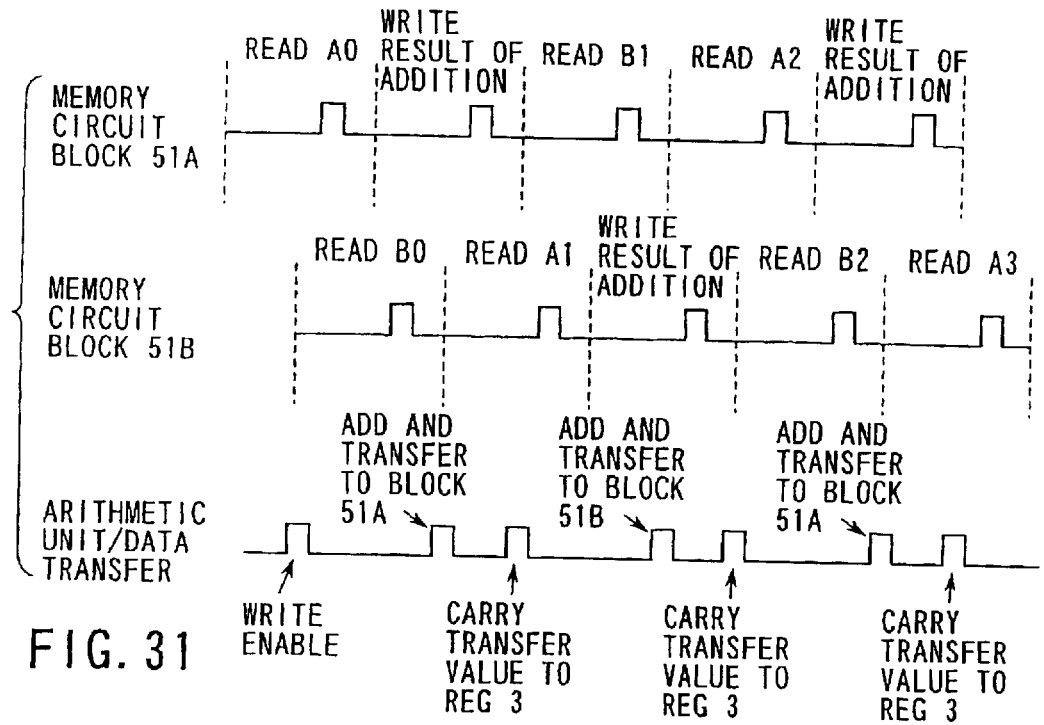
FIG. 31 is a timing chart typically showing a data writing and reading timing in two memory circuit blocks, an operating timing of an arithmetic unit and a data transfer timing which are obtained when addition is to be carried out by the PE illustrated in FIG. 30.

FIG. 31 typically shows a data writing and reading timing in the memory circuit blocks 51A and 51B, an operating timing of the arithmetic unit 53 and a data transfer timing in the addition of the PE illustrated in FIG. 30.

Also in this case, the operation is carried out from a low order bit every bit. First of all, a write enable signal is sent from the arithmetic unit 53 to the write enable register WEREG and the write of both of the memory circuit blocks 51A and 51B is enabled. Then, data A0 is read from the memory circuit block 51A and is sent to the register REG 1. Subsequently, data B0 is read from the memory circuit block 51B and is sent to the register REG 2. Thereafter, the contents of the register REG 1 and the REG 2 are added by the arithmetic unit 53, and the result of the addition is output from the arithmetic unit 53. The output data are sent to the signal input/output circuit 52A on the memory circuit block 51A, and are then written to the memory circuit block 51A. Subsequently, carry data are calculated by the arithmetic unit 53 by using the contents of the register REG 1 and REG 2, and are sent to the register REG 3. Next, data A1 is read from the memory circuit block 51B and is sent to the register REG 1. Subsequently, data B1 is read from the memory circuit block 51A and is sent to the register REG 2. Then, the contents of the registers REG 1, REG 2 and REG 3 are added by the arithmetic unit 53 and the result of the addition is output from the arithmetic unit 53. The output data are sent to the signal input/output circuit 52B of the memory circuit block 51B and are then written to the memory circuit block 51B. In the same manner, subsequently, two kinds of 4-bit data A0 to A3 and B0 to B3 are added by performing the operation of each of 2-bit data stored in both of the memory circuit blocks 51A and 51B. As a result of the addition, each of even-numbered data bits is stored in the memory circuit block 51A and each of odd-numbered data bits is stored in the memory circuit block 51B.

As shown in FIG. 31, the phases of data reading and writing cycles in the two memory circuit blocks 51A and 51B are shifted. The data reading and writing cycles of one of the memory circuit blocks are started in the middle of the data reading and writing cycle period of the other memory circuit block, and the data reading and writing periods of both of the memory circuit blocks are overlapped. Consequently, the data reading and writing band width of the memory circuit is doubled.

With such a structure, moreover, the data reading and writing cycles of both of the memory circuit blocks are shifted from each other by a half cycle in such a manner that the signal processing in the arithmetic unit 53 is smoothly carried out. The operation to be carried out by the arithmetic unit 53 and the data transfer are executed during the data reading and writing of the two memory circuit blocks. Thus, the data can be read from and written to the memory circuit at a speed which is twice as high as in the PE shown in FIG. 27. As a result, the signal processing speed is doubled.

Furthermore, the memory circuit is simply divided into the two memory circuit blocks. Therefore, the area occupied by the circuit is almost the same as in FIG. 27.

Figure 32:
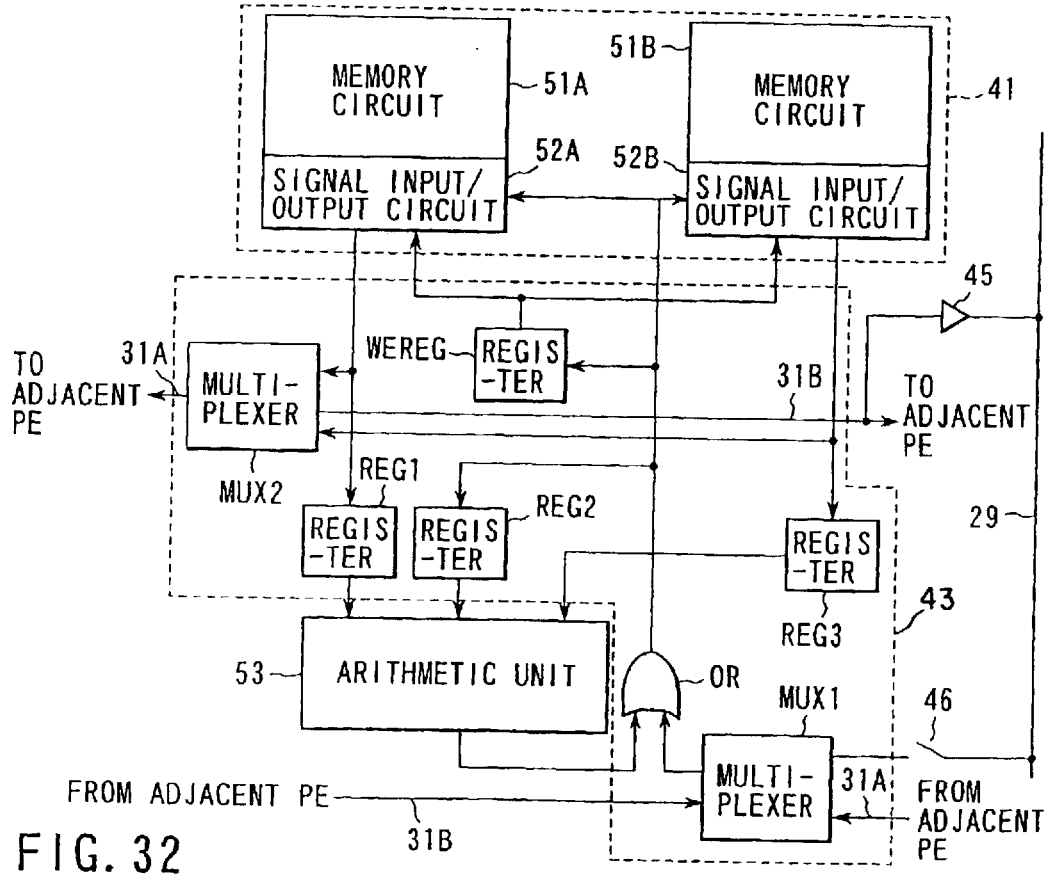
FIG. 32 is a diagram showing another example of the specific structure of the PE to be used in the present invention.

FIG. 32 shows another structure of the PE to be used in the present invention. In the PE shown in FIG. 32, the memory circuit 51 in the PE shown in FIG. 29 is divided into the two memory circuit blocks 51A and 51B and the signal input/output circuits 52A and 52B corresponding to the signal input/output circuit 52 are provided for the two memory circuit blocks 51A and 51B, respectively. Differently from FIG. 29, furthermore, the output node of the write enable register WEREG is connected to each of the input nodes of the two signal input/output circuits 52A and 52B, and the input node of the register REG 3 is connected to the data output node of the signal input/output circuit 52B on the memory circuit block 51B. Moreover, another multiplexer MUX2 is added.

The data transferred from another PE positioned on the left side in the drawing for the shown PE are input to the multiplexer MUX1 through the wiring 31B, the data transferred from another PE positioned on the right side in the drawing for the shown PE are input to the multiplexer MUX1 through the wiring 31A, and the data transferred through the wiring 29 are input to the multiplexer MUX1 through the switch 46. One of these data is selected and sent to the OR circuit OR. An output from the arithmetic unit 53 is also input to the OR circuit OR. The output of the OR circuit OR is input to each of the data input nodes of the two signal input/output circuits 52A and 52B, the input node of the write enable register WEREG and the input node of the register REG 2, respectively.

The read data of the memory circuit blocks 52A and 52B are input from the signal input/output circuits 52A and 52B to the multiplexer MUX2. One of both data is selected by the multiplexer MUX2 and is output through the wiring 31A to another PE positioned on the left side in the drawing for the shown PE, through the wiring 31B to another PE positioned on the right side in the drawing for the shown PE and through the 3-state buffer 45 to the wiring 29.

Also in this case, the phases of the data reading and writing period cycles in the two memory circuit blocks 51A and 51B are shifted by a half cycle, and the signal processing speed of the PE is increased more than in FIG. 29 and can be doubled. Moreover, it is sufficient that the memory circuit is divided into two memory circuit blocks and only the multiplexer MUX2 is added. Therefore, the area occupied by the circuit is almost the same as in FIG. 29.

According to the present invention, thus, it is possible to provide a processor capable of processing image data at a high speed.

According to the present invention, furthermore, it is possible to provide an image input system capable of processing image data at a high speed and reducing power consumption.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A signal processing device comprising:
a plurality of processors, each of the processors including a plurality of processing elements having the same data processing function, each of the processors receiving a control signal, and the plurality of processing elements in the processor carrying out a data processing in parallel in response to the control signal;
a controller for giving the control signal to the processors; and
a plurality of data transfer lines provided for mutually transferring data between the plurality of processing elements belonging to the processors which are different from each other; and
wherein each of the plurality of processing elements comprises:
a memory circuit for storing data;
an arithmetic unit for receiving at least data read out from the memory circuit and performs an arithmetic operation; and
a data input/output unit, connected among the memory circuit, the arithmetic unit and one of the plurality of data transfer lines, for transmitting and receiving data among the memory circuit, the arithmetic unit and the one of the data transfer lines, the data input/output unit including a data input/output circuit, an output circuit having an input node connected to the data input/output circuit and an output node connected to the one data transfer line, and a switch circuit for taking in data, the switch circuit having one end connected to the data input/output circuit and the other end connected to the one data transfer line, wherein the output circuit within the processing element connected to the one data transfer line outputs data output from the associated data input/output circuit to the one data transfer line, and the switch circuit within at least one of the processing elements connected to the one data transfer line simultaneously inputs data on the one data transfer line to the associated data input/output circuit;
wherein the output circuit is a three-value output circuit, an output from which takes one of a logic 0 state, a logic 1 state and a high-impedance state,
each of the plurality of data transfer lines comprises a single wiring for transferring one-bit data, and
the output circuit within one of the processing elements connected to each of the plurality of data transfer lines outputs one of logic 0 data and logic 1 data to the data transfer line, the output circuits within the remaining ones of the processing elements connected to the same data transfer line takes the high-impedance state, and the switch circuit within at least one of the remaining ones of the processing elements connected to the same data transfer line simultaneously takes in data on the data transfer line.

2. The device according to claim 1, wherein the number of the processing elements in the processor is equal to that of the processors, and
the respective processing elements belonging to the processors which are different from each other are connected to the respective data transfer lines.

3. The device according to claim 1, wherein the processors receive the same control signal generated by the controller.

4. The device according to claim 1, wherein the processors receive control signals generated by the controller which are different from each other.

5. A signal processing device comprising:
a plurality of processors, each of the processors including a plurality of processing elements having the same data processing function, each of the processors receiving a control signal, and the plurality of processing elements in the processor carrying out a data processing in parallel in response to the control signal; and
a plurality of data transfer lines provided for mutually transferring data between the plurality of processing elements belonging to the processors which are different from each other, wherein each of the plurality of processing elements includes;

a random access memory circuit divided into first and second memory circuit blocks;

a first signal input/output circuit provided to the first memory circuit block for reading data from the first memory circuit block and for writing data to the first memory circuit block;

a second signal input/output circuit provided to the second memory circuit block for reading data from the second memory circuit block and for writing data to the second memory circuit block;

an arithmetic unit for carrying out an operation on receipt of at least output data from the first and second signal input/output circuits;

a first data transfer path for giving a result of the operation to the first and/or second signal input/output circuits;

a second data transfer path for giving a result of the operation by the arithmetic unit to the other processing elements in the same processor and giving data from the other processing elements in the same processor to the arithmetic unit;

a data output circuit, connected to the first data transfer path and one of the plurality of data transfer lines, for receiving data from the first data transfer path and for transmitting the data to the one data transfer line; and a switch circuit connected between one of the plurality of data transfer lines and the first data transfer path, for receiving data from the one data transfer line and for transmitting the data to the first data transfer path, wherein one of a plurality of the data output circuits connected to one data transfer line outputs data on the associated first data transfer path to the data transfer line, and at least two of a plurality of the switch circuits connected to the one data transfer line input data on the data transfer line to the first data transfer path; and wherein the first and second memory circuit blocks are operated by shifting the phases of the data reading and writing cycles by a half cycle.

6. A signal processing device comprising:

a plurality of processors, each of the processors including a plurality of processing elements having the same data processing function, each of the processors receiving a control signal, and the plurality of processing elements in the processor carrying out a data processing in parallel in response to the control signal; and a plurality of data transfer lines provided for mutually transferring data between the plurality of processing elements belonging to the processors which are different from each other, wherein each of the plurality of processing elements includes:

a memory circuit for storing data;

an arithmetic unit for receiving at least data read out from the memory circuit and performs an arithmetic operation; and a data input/output unit, connected among the memory circuit, the arithmetic unit and one of the plurality of data transfer lines, for transmitting and receiving data among the memory circuit, the arithmetic unit and the one of the data transfer lines, the data input/output unit including a data input/output circuit, an output circuit having an input node connected to the data input/output circuit and an output node connected to the one data transfer line, and a switch circuit for taking in data, the switch circuit having one end connected to the data input/output circuit and the other end connected to the one data transfer line, wherein data output from the data input/output circuit associated with the output circuit within the processing element connected to the one data transfer line is output to the one data transfer line, and the switch circuit within at least one of the processing elements connected to the one data transfer line inputs data on the one data transfer line to the associated data input/output circuit; and wherein the output circuit is a three-value output circuit, an output from which takes one of a logic 0 state, a logic 1 state and a high-impedance state, each of the plurality of data transfer lines comprises a single wiring for transferring one-bit data, and the output circuit within one of the processing elements connected to each of the plurality of data transfer lines outputs one of logic 0 data and logic 1 data to the data transfer line, the output circuits within the remaining ones of the processing elements connected to the same data transfer line takes the high-impedance state, and the switch circuit within at least one of the remaining ones of the processing elements connected to the same data transfer line simultaneously takes in data on the data transfer line.

7. A signal processing device comprising:

a plurality of processors, each of the processors including a plurality of processing elements having the same data processing function, each of the processors receiving a control signal, and the plurality of processing elements in the processor carrying out a data processing in parallel in response to the control signal;

a controller for giving the control signal to the processors; and a plurality of data transfer lines provided for mutually transferring data between the plurality of processing elements belonging to the processors which are different from each other; and wherein each of the plurality of processing elements includes:

a random access memory circuit divided into first and second memory circuit blocks;

a first signal input/output circuit provided to the first memory circuit block for reading data from the first memory circuit block and for writing data to the first memory circuit block;

a second signal input/output circuit provided to the second memory circuit block for reading data from the second memory circuit block and for writing data to the second memory circuit block;

an arithmetic unit for carrying out an operation on receipt of an output from the first and second signal input/output circuits and data transferred from the other processing elements through the plurality of data transfer lines;

a first data transfer path for giving data transferred from other processing elements to the arithmetic unit;

a second data transfer path for giving a result of the operation to the first and second signal input/output circuits; and a third data transfer path for transferring the result of the operation in the arithmetic unit to the other processing elements, wherein the first and second memory circuit blocks are operated by shifting phases of data reading and writing cycles.

8. The device according to claim 7, wherein the number of the processing elements in the processor is equal to that of the processors, and the respective processing elements belonging to the processors which are different from each other are connected to the respective data transfer lines.

9. The device according to claim 7, wherein the processors receive the same control signal generated by the controller.

10. The device according to claim 7, wherein the processors receive control signals generated by the controller which are different from each other.

11. The device according to claim 7, wherein the first and second memory circuit blocks are operated by shifting the phases of the data reading and writing cycles by a half cycle.

12. The device according to claim 7, wherein data for one bit are read from the first and second memory circuit blocks, the arithmetic unit sequentially carries out an operation every bit, odd-numbered data bits of the results of the operation are stored in one of the first and second memory circuit block and even-numbered data bits of the results of the operation are stored in the other memory circuit block.

13. A signal processing device comprising:

a plurality of processors, each of the processors including a plurality of processing elements having the same data processing function, each of the processors receiving a control signal, and the plurality of processing elements in the processor carrying out a data processing in parallel in response to the control signal; and a plurality of data transfer lines provided for mutually transferring data between the plurality of processing elements belonging to the processors which are different from each other, wherein each of the plurality of processing elements includes:

a random access memory circuit divided into first and second memory circuit blocks;

a first signal input/output circuit provided to the first memory circuit block for reading data from the first memory circuit block and for writing data to the first memory circuit block;

a second signal input/output circuit provided to the second memory circuit block for reading data from the second memory circuit block and for writing data to the second memory circuit block;

an arithmetic unit for carrying out an operation on receipt of at least output data from the first and second signal input/output circuits;

a first data transfer path for giving a result of the operation to the first and/or second signal input/output circuits;

a second data transfer path for giving a result of the operation by the arithmetic unit to the other processing elements in the same processor and giving data from the other processing elements in the same processor to the arithmetic unit;

a data output circuit, connected to the first data transfer path and one of the plurality of data transfer lines, for receiving data from the first data transfer path and for transmitting the data to the one data transfer line; and a switch circuit connected between one of the plurality of data transfer lines and the first data transfer path, for receiving data from the one data transfer line and for transmitting the data to the first data transfer path, wherein one of a plurality of the data output circuits connected to one data transfer line outputs data on the associated first data transfer path to the data transfer line, and at least two of a plurality of the switch circuits connected to the one data transfer line input data on the data transfer line to the first data transfer path; and wherein data for one bit are read from the first and second memory circuit blocks, the arithmetic unit sequentially carries out an operation every bit, odd-numbered data bits of the results of the operation are stored in one of the first and second memory circuit blocks and even-numbered data bits of the results of the operation are stored in the other memory circuit block.

* * * * *

UNITED STATES PATENT AND TRADEMARK OFFICE
CERTIFICATE OF CORRECTION

PATENT NO. : 6,928,535 B2 Page 1 of 1
APPLICATION NO. : 10/195477
DATED : August 9, 2005
INVENTOR(S) : Hirofumi Yamashita et al.

It is certified that error appears in the above-identified patent and that said Letters Patent is hereby corrected as shown below:

On the Title Page, Assignee section (73):
　　Please add --Massachusetts Institute of Technology, Cambridge, MA--

Signed and Sealed this

Second Day of January, 2007

JON W. DUDAS
*Director of the United States Patent and Trademark Office*